United States Patent
Kawakami et al.

(10) Patent No.: US 9,860,097 B2
(45) Date of Patent: Jan. 2, 2018

(54) TRANSMITTING DEVICE, RECEIVING DEVICE, AND TRANSMITTING AND RECEIVING SYSTEM

(71) Applicants: THE UNIVERSITY OF TOKYO, Tokyo (JP); FUJI ELECTRIC CO., LTD., Kawasaki (JP)

(72) Inventors: Haruki Kawakami, Kawasaki (JP); Tohru Asami, Saitama (JP); Yoshihiro Kawahara, Tokyo (JP); Masami Kishiro, Tokyo (JP); Takahiro Kudo, Yokohama (JP)

(73) Assignees: FUJI ELECTRIC CO., LTD., Kawasaki (JP); THE UNIVERSITY OF TOKYO, Tokyo (JP)

( * ) Notice: Subject to any disclaimer, the term of this patent is extended or adjusted under 35 U.S.C. 154(b) by 19 days.

(21) Appl. No.: 14/976,823

(22) Filed: Dec. 21, 2015

(65) Prior Publication Data
US 2016/0112227 A1 Apr. 21, 2016

Related U.S. Application Data

(63) Continuation of application No. PCT/JP2014/084427, filed on Dec. 25, 2014.

(30) Foreign Application Priority Data

Jan. 7, 2014 (JP) .................. 2014-001251

(51) Int. Cl.
*H03M 7/30* (2006.01)
*H04L 27/22* (2006.01)
*H04B 1/04* (2006.01)
*H04J 11/00* (2006.01)

(52) U.S. Cl.
CPC .......... *H04L 27/22* (2013.01); *H03M 7/3062* (2013.01); *H04B 1/04* (2013.01); *H04J 11/00* (2013.01)

(58) Field of Classification Search
CPC ........ H03M 7/30; H03M 7/3062; H04B 1/66; H04B 1/68
See application file for complete search history.

(56) References Cited

U.S. PATENT DOCUMENTS 9,015,007 B2 * 4/2015 Casey ................. H03M 7/3062 702/179
2010/0310011 A1 * 12/2010 Sexton .................. H03M 1/129 375/316
2011/0276612 A1 11/2011 Droz et al.
(Continued)

FOREIGN PATENT DOCUMENTS

JP 57-700 1/1982
JP 2011-193431 9/2011
(Continued)

OTHER PUBLICATIONS

English language translation of JP2011-193431.*
(Continued)

*Primary Examiner* — Sophia Vlahos

(57) ABSTRACT

A transmitting device includes: a compressing unit configured to generate and output a compressed digital signal that has been compressed, by converting an input digital signal by use of a Walsh function and extracting a specific frequency component.

10 Claims, 21 Drawing Sheets

(56) References Cited

U.S. PATENT DOCUMENTS

| | | | | |
|---|---|---|---|---|
| 2012/0249353 | A1* | 10/2012 | Khajehnejad | H03M 7/3062 341/144 |
| 2013/0069807 | A1* | 3/2013 | Sestok | H03M 7/00 341/110 |
| 2013/0070624 | A1* | 3/2013 | Nguyen | H03M 7/30 370/252 |

FOREIGN PATENT DOCUMENTS

| | | |
|---|---|---|
| JP | 2012-507906 | 3/2012 |
| JP | 2013-90097 | 5/2013 |

OTHER PUBLICATIONS

International Search Report dated Mar. 3, 2015, in corresponding International Application No. PCT/JP2014/084427.
Zhuoran et al., "An Improved Hadamard Measurement Matrix Based on Walsh Code for Compressive Sensing", *Information, Communications and Signal Processing (ICICS) 2013 9th International Conference on*, Dec. 2013, pp. 1-4.
Sasaki, "Implementation of Compressive Sensing on Sensor Node by Use of Circulation Matrix and Evaluation of Power Consumption", *IPSJ SIG Technical Report*, Nov. 11, 2012, pp. 1-8.
International Preliminary Report on Patentability dated Jul. 12, 2016 in corresponding International Patent Application PCT/JP2014/084427.
Extended European Search Report dated Jul. 21, 2017 in corresponding European Patent Application No. 14877894.7.
Sharma Shree Krishna et al: "Spectral efficient compressive transmission framework for wireless communication systems", IET Signal Process, The Institution of Engineering and Technology, Michael Faraday House, Six Hills Way, Stevenage, Herts. SG1 2AY, UK, vol. 7, No. 7, Sep. 1, 2013, pp. 558-564, XP006046564.
Anonymous: "Hadamard transform", Wikipedia, Dec. 6, 2013, XP0055388611, Retrieved From the Internet: URL: https://en.wikipedia.org/w/index.php?title=Hadamard_transform&oldid=584861968.
Anonymous et al.: "Walsh function", Dec. 18, 2013, XP055388475, Retrieved from the Internet: URL: https://en.wikipedia.org/w/index.php?title=Walsh_function&oldid=586603661.
Anonymous: "Data Compression", Wikipedia, Jan. 5, 2014, XP055388502, Retrieved from Internet: URL: https://en.wikipedia.org/w/index.php?title=Data_compression&oldid=589250747.
N. Blachman: "Some Comments Concerning Walsh Functions", IEEE Transaction on Information Theory, vol. 18, No. 3, May 1, 1972, pp. 427-428, XP055388634.
Anonymous: "Walsh Functions", Stanford University Online Repository, Dec. 18, 1997, XP055388569, Retrieved from the Internet: URL: http://sepwww.stanford.edu/public/docs/sep70/carlos1/paper_html/node5.html.

* cited by examiner

FIG.5

$$x = \begin{bmatrix} X_1 \\ X_2 \\ X_3 \\ \cdot \\ \cdot \\ \cdot \\ X_{N-1} \\ X_N \end{bmatrix}$$

FIG.6

$$\Phi_a = \begin{bmatrix} a_{1,1} & a_{1,2} & a_{1,3} & \cdot \cdot & a_{1,N-1} & a_{1,N} \\ a_{2,1} & \cdot & \cdot & \cdot \cdot & \cdot & a_{2,N} \\ \cdot & \cdot & \cdot & \cdot \cdot & \cdot & \cdot \\ \cdot & \cdot & \cdot & \cdot \cdot & \cdot & \cdot \\ a_{M,1} & \cdot & \cdot & \cdot \cdot & \cdot & a_{M,N} \end{bmatrix}$$

FIG.7

$$d = \begin{bmatrix} d_1 \\ d_2 \\ \cdot \\ \cdot \\ d_M \end{bmatrix}$$

FIG.8

$$\Psi = \begin{bmatrix} b_{1,1} & b_{1,2} & b_{1,3} & \cdots & b_{1,N-1} & b_{1,N} \\ b_{2,1} & \cdot & \cdot & \cdots & \cdot & b_{2,N} \\ b_{3,1} & \cdot & \cdot & \cdots & \cdot & b_{3,N} \\ \cdot & \cdot & \cdot & \cdots & \cdot & \cdot \\ \cdot & \cdot & \cdot & \cdots & \cdot & \cdot \\ \cdot & \cdot & \cdot & \cdots & \cdot & \cdot \\ b_{N-1,1} & \cdot & \cdot & \cdots & \cdot & b_{N-1,N} \\ b_{N,1} & \cdot & \cdot & \cdots & \cdot & b_{N,N} \end{bmatrix}$$

FIG.9

$$H(2^{n+1}) = \begin{bmatrix} H(2^n) & H(2^n) \\ H(2^n) & -H(2^n) \end{bmatrix}$$

$$H(2^1) = \begin{bmatrix} 1 & 1 \\ 1 & -1 \end{bmatrix}$$

$$H(2^2) = \begin{bmatrix} 1 & 1 & 1 & 1 \\ 1 & -1 & 1 & -1 \\ 1 & 1 & -1 & -1 \\ 1 & -1 & -1 & 1 \end{bmatrix}$$

$$H(2^3) = \begin{bmatrix} 1 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{bmatrix}$$

FIG.12

$$\Phi = \begin{bmatrix} W_{1,1} & W_{1,2} & W_{1,3} & \cdots & W_{1,N} \\ W_{2,1} & W_{2,2} & & & W_{2,N} \\ W_{3,1} & & & & W_{3,N} \\ \vdots & & & & \vdots \\ W_{N-1,1} & & & & W_{N-1,N} \\ W_{N,1} & & & & W_{N,N} \end{bmatrix}$$

$$\Rightarrow \Phi_a = \begin{bmatrix} W_{k,1} & \cdots & W_{k,2} & \cdots & W_{k,N} \\ W_{k+1,1} & & \cdot & & W_{k+1,N} \\ \vdots & & \cdot & & \vdots \\ W_{k+M-1,1} & & \cdot & & W_{k+M-1,N} \end{bmatrix}$$

FIG.15

$$\psi = \frac{1}{N}\begin{bmatrix} 1 & 1 & 1 & \cdots & \cdots & \cdots & 1 & 1 & 1 \\ 1 & e^{\frac{2\pi j}{N}} & e^{\frac{4\pi j}{N}} & \cdots & \cdots & \cdots & e^{\frac{2\pi j}{N}(N-3)} & e^{\frac{2\pi j}{N}(N-2)} & e^{\frac{2\pi j}{N}(N-1)} \\ 1 & e^{\frac{4\pi j}{N}} & e^{\frac{8\pi j}{N}} & \cdots & \cdots & \cdots & e^{\frac{4\pi j}{N}(N-3)} & e^{\frac{4\pi j}{N}(N-2)} & e^{\frac{4\pi j}{N}(N-1)} \\ \vdots & \vdots & \vdots & \ddots & & & \vdots & \vdots & \vdots \\ \vdots & \vdots & \vdots & & \ddots & & \vdots & \vdots & \vdots \\ \vdots & \vdots & \vdots & & & \ddots & \vdots & \vdots & \vdots \\ 1 & e^{\frac{2\pi j}{N}(N-3)} & e^{\frac{4\pi j}{N}(N-3)} & \cdots & \cdots & \cdots & e^{\frac{2\pi j}{N}(N-3)^2} & e^{\frac{2\pi j}{N}(N-2)(N-3)} & e^{\frac{2\pi j}{N}(N-1)(N-3)} \\ 1 & e^{\frac{2\pi j}{N}(N-2)} & e^{\frac{4\pi j}{N}(N-2)} & \cdots & \cdots & \cdots & e^{\frac{2\pi j}{N}(N-3)(N-2)} & e^{\frac{2\pi j}{N}(N-2)^2} & e^{\frac{2\pi j}{N}(N-1)(N-2)} \\ 1 & e^{\frac{2\pi j}{N}(N-1)} & e^{\frac{4\pi j}{N}(N-1)} & \cdots & \cdots & \cdots & e^{\frac{2\pi j}{N}(N-3)(N-1)} & e^{\frac{2\pi j}{N}(N-2)(N-1)} & e^{\frac{2\pi j}{N}(N-1)^2} \end{bmatrix}$$

FIG.21

$$EXTRACTION\ DATA = \begin{bmatrix} 0 \\ 0 \\ 1 \\ 1 \\ 1 \\ 0 \\ 1 \\ 0 \end{bmatrix}$$

FIG.22

$$REARRANGEMENT\ DATA = \begin{bmatrix} 3 \\ 4 \\ 1 \\ 2 \end{bmatrix}$$

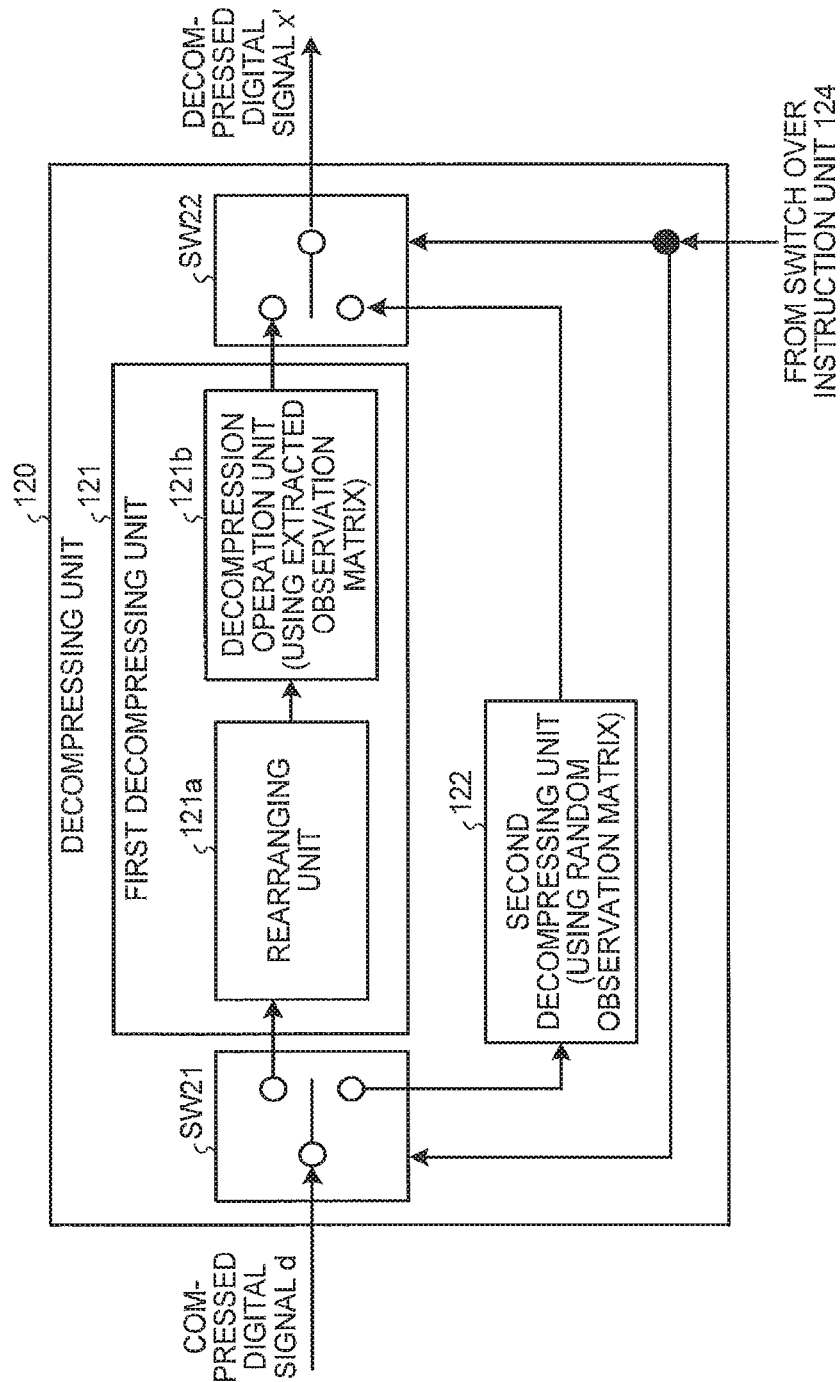

TRANSMITTING DEVICE, RECEIVING DEVICE, AND TRANSMITTING AND RECEIVING SYSTEM

CROSS-REFERENCE TO RELATED APPLICATION(S)

This application is a continuation of PCT international application Ser. No. PCT/JP2014/084427 filed on Dec. 25, 2014 which designates the United States, incorporated herein by reference, and which claims the benefit of priority from Japanese Patent Application No. 2014-001251, filed on Jan. 7, 2014, incorporated herein by reference.

BACKGROUND

1. Field of the Invention

The disclosure relates to a transmitting device, a receiving device, and a transmitting and receiving system, which enable accurate decompression even if the original input digital signal has low sparsity.

2. Related Art

In wireless sensor nodes, for which low power consumption is demanded, reducing the wireless transmission power, which largely accounts for the power consumption, is indispensable. One of techniques therefor is reducing the wireless transmission power by reducing the amount of data by data compression of transmission data.

In general data compression, compression techniques, such as of ZIP and LZH, are often used. Data compression by these compression techniques requires many arithmetic operations, and thus is not suitable for implementation on wireless sensor nodes, for which low power consumption is demanded. For example, if such data compression is applied to a wireless sensor node, power consumed by compression operations may become greater than the amount of reduction in the wireless transmission power and the overall power consumption may actually be increased.

Compressive sensing is a technique that allows data compression with low power consumption. Compressive sensing is described in detail in, for example, "Implementation of Compressive Sensing on Sensor Node by Use of Circulation Matrix and Evaluation of Power Consumption", by Tatsuya Sasaki, IPSJ SIG Technical Report 2012 (hereinafter, referred to as Sasaki document). Briefly stated, this compressive sensing is a technique for accurately executing decompression into the original signal, from data that have been compressed to a small number of data, by utilizing signal sparsity, which many signals in nature are said to have. In compressive sensing, since compression operations are executed with matrix products only, the operations are easy, and in particular, in the Sasaki document, by using, as a matrix used in the arithmetic operation, a random observation matrix, in which ±1 is randomly arranged as the elements, compression operations are realized by addition and subtraction only.

Specifically, if the number of original data is N, and the number of data that have been compressed as a result of compression operations is M, N>M is satisfied, naturally. If the original data are represented by an input digital signal x, which is an N-dimensional vector, and the data after compression are represented by a compressed digital signal d, which is an M-dimensional vector, by compression operations in compressive sensing, as expressed by the following Equation (1), the compressed digital signal d is able to be found by multiplying the input digital signal x by an observation matrix $\Phi$ of M rows and N columns.

$$d = \Phi x \quad (1)$$

The original input digital signal x needs to have sparsity. When the input digital signal x has sparsity, the input digital signal x is expressed by the following Equation (2) by use of an appropriate basis transformation matrix $\Psi$ of N rows and N columns.

$$x = \Psi s \quad (2)$$

When s is an N-dimensional vector and the input digital signal x has sparsity, most of the vector components of s become 0.

If a matrix having random elements is used as the observation matrix $\Phi$ when the input digital signal x has the above mentioned sparsity, based on the observation matrix $\Phi$, the basis transformation matrix $\Psi$, and the compressed digital signal d, by use of L1-norm minimization or the like, the original input digital signal x is able to be accurately decompressed.

In the Sasaki document, by using, as the observation matrix $\Phi$, the matrix with randomly arranged ±1, compression operations are realized by addition and subtraction only. Further, the amount of arithmetic operations upon data compression is M×N since Equation (1) represents matrix product operation.

Further, in Japanese Patent Application Publication No. 2013-90097, a technique, for reducing the amount of arithmetic operations upon data compression from M×N to N+N×(log 2)N, by use of FFT, is disclosed.

SUMMARY

In some embodiments, a transmitting device includes: a compressing unit configured to generate and output a compressed digital signal that has been compressed, by converting an input digital signal by use of a Walsh function and extracting a specific frequency component.

In some embodiments, a receiving device includes: a decompressing unit configured to decompress a compressed digital signal, which has been compressed by being converted by use of a Walsh function and a specific frequency component being extracted, into a transmission side input digital signal, by using an observation matrix corresponding to a Walsh function of the specific frequency component.

In some embodiments, a transmitting and receiving system includes: a transmitting device, having: a compressing unit configured to generate and output a compressed digital signal that has been compressed, by converting an input digital signal by use of a Walsh function and extracting a specific frequency component; and a transmitting unit configured to wirelessly transmit and output the compressed digital signal; and a receiving device, having: a receiving unit configured to receive the compressed digital signal wirelessly transmitted and output by the transmitting unit; and a decompressing unit configured to decompress the compressed digital signal received by the receiving unit into the input digital signal by using an observation matrix corresponding to a Walsh function of the specific frequency component.

In some embodiments, a transmitting and receiving system includes: a transmitting device, having: a first compressing unit configured to generate and output a first compressed digital signal that has been compressed, by converting an input digital signal by use of a Walsh function and extracting a specific frequency component; a second compressing unit configured to generate and output a second compressed digital signal that has been compressed, by converting an input digital signal with an observation matrix that uses a random matrix; a transmission side switch over unit configured to switch over, based on a switch over instruction signal, between processes by the first compressing unit and the second compressing unit; and a transmitting unit configured to wirelessly transmit and output the first compressed digital signal or the second compressed digital signal that has been output by the switch over by the transmission side switch over unit; and a receiving device, having: a receiving unit configured to receive the first compressed digital signal or the second compressed digital signal that has been wirelessly transmitted and output by the transmitting unit; a first decompressing unit configured to decompress the first compressed digital signal into the input digital signal by using an observation matrix corresponding to a Walsh function of the specific frequency component, when the switch over instruction signal instructs the process by the first compressing unit; a second decompressing unit configured to decompress the second compressed digital signal into the input digital signal by using the observation matrix that uses the random matrix, when the switch over instruction signal instructs the process by the second compressing unit; a reception side switch over unit configured to switch over, based on the switch over instruction signal, between processes by the first decompressing unit and the second decompressing unit; and a switch over instruction unit configured to send out the switch over instruction signal to the transmission side switch over unit and the reception side switch over unit.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a diagram of a vector representation of an input digital signal;

FIG. 6 is a diagram illustrating a matrix used in compression or decompression by a compressing unit and a decompressing unit in the first embodiment;

FIG. 7 is a diagram of a vector representation of a compressed digital signal;

FIG. 8 is a diagram of a matrix representation of a basis transformation matrix used in a decompression process of the decompressing unit in the first embodiment;

FIG. 9 is a diagram illustrating a relation between a $2^n$-th order Hadamard matrix $H(2^n)$ and a $2^{n+1}$-th order Hadamard matrix $H(2^{n+1})$;

FIG. 10 is a diagram illustrating generation of Hadamard matrices of up to $2^3$-th order specifically expressed with numerical values, based on the relation illustrated in FIG. 9;

FIG. 12 is a diagram schematically illustrating a state of generating an extracted observation matrix extracting a specific frequency component, from an observation matrix corresponding to a Walsh function;

FIG. 15 is a diagram illustrating the basis transformation matrix corresponding to the inverse discrete Fourier transform;

FIG. 21 is a diagram illustrating an example of extraction data specifying a specific frequency desired to be extracted;

FIG. 22 is a diagram illustrating an example of rearrangement data held by a rearranging unit;

FIG. 31 is a block diagram illustrating a detailed configuration of a decompressing unit according to the modification of the third embodiment.

DETAILED DESCRIPTION

Hereinafter, with reference to the appended drawings, modes for carrying out this invention will be described.

First Embodiment

Figure 1:
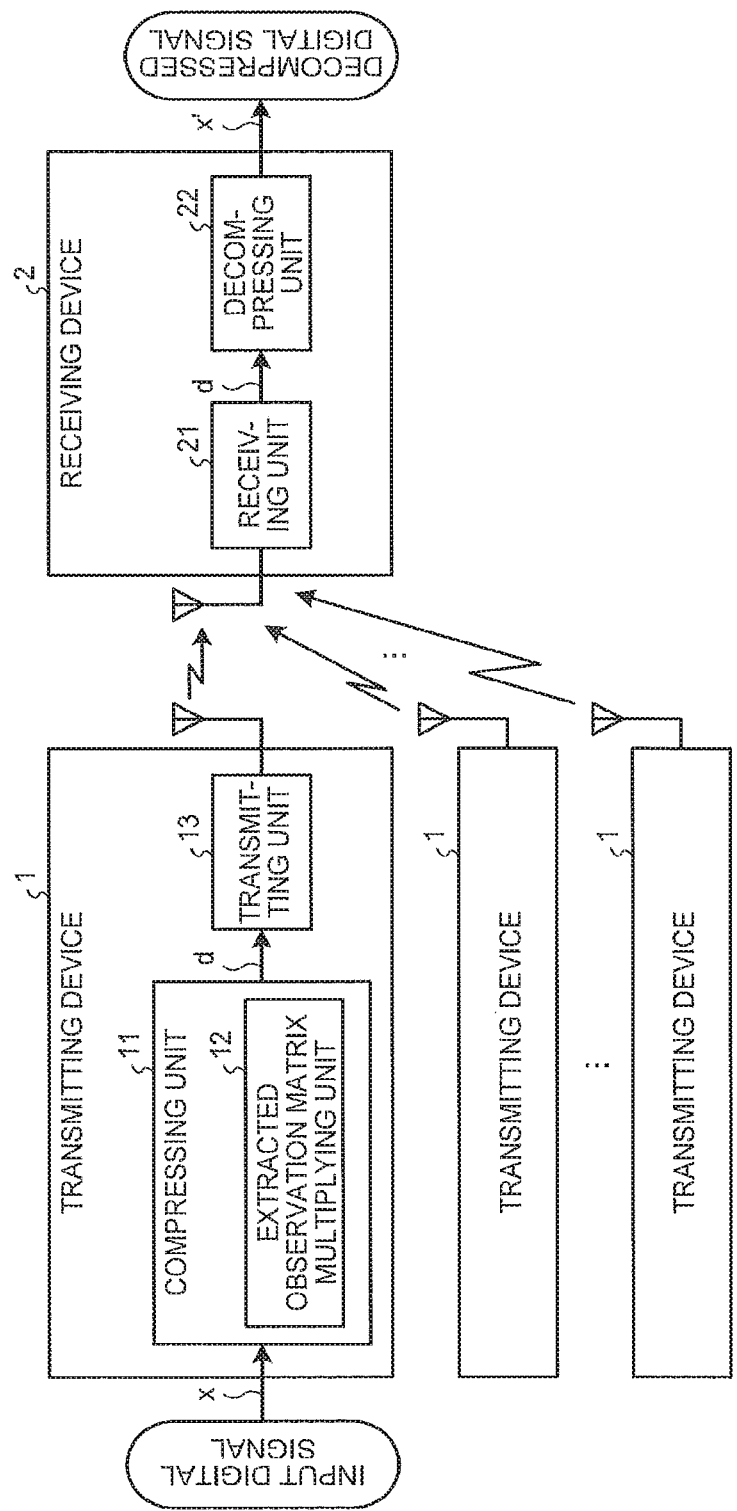
FIG. 1 is a block diagram illustrating an overall configuration of a transmitting and receiving system, which is a first embodiment of this invention.

FIG. 1 is a block diagram illustrating an overall configuration of a transmitting and receiving system, which is a first embodiment of this invention. In this transmitting and receiving system, for example, an accelerometer not illustrated measures an acceleration component of vibration of a structure, and input digital signals x that have been converted into digital signals by an analog-digital converter not illustrated are respectively input to plural transmitting devices 1 corresponding thereto. In each of the transmitting devices 1, a compressing unit 11 generates a compressed digital signal d by compressing the input digital signal x, and a transmitting unit 13 transmits this compressed digital signal d to a receiving device 2 side. In the receiving device 2, a receiving unit 21 receives the compressed digital signal d transmitted from the transmitting device 1, and a decompressing unit 22 decompresses this compressed digital signal d and outputs it as a decompressed digital signal x'. The receiving device 2 receives and decompresses plural compressed digital signals d transmitted from the respective transmitting devices 1, but herein, reception and decompression of a compressed digital signal d transmitted from one transmitting device 1 will be described.

Figure 2:
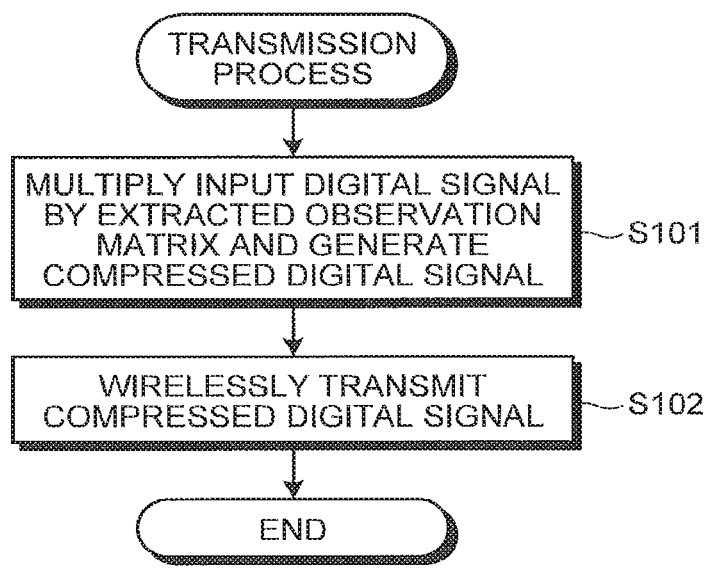
FIG. 2 is a flow chart illustrating an outline of a transmission procedure by a transmitting device of the first embodiment.
Figure 3:
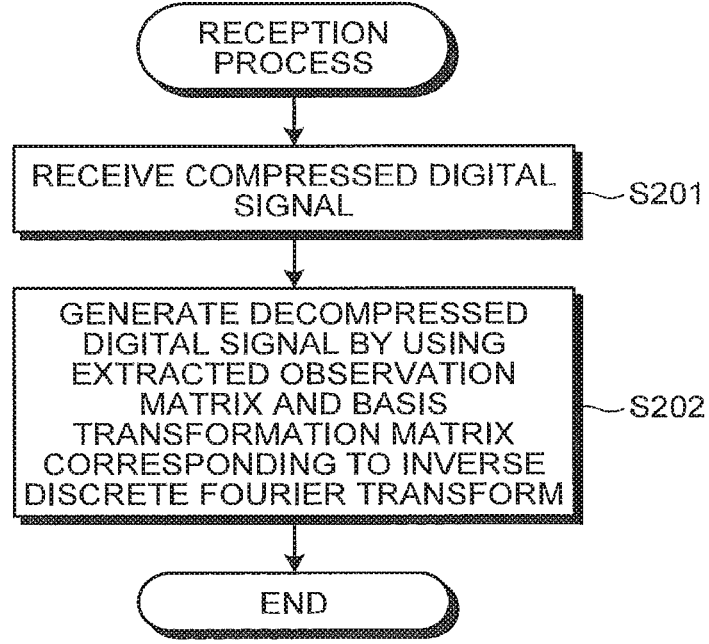
FIG. 3 is a flow chart illustrating an outline of a reception procedure by a receiving device of the first embodiment.

FIG. 2 is a flow chart illustrating an outline of a transmission procedure by the transmitting device 1. Further, FIG. 3 is a flow chart illustrating an outline of a reception procedure by the receiving device 2. As illustrated in FIG. 2, first, an input digital signal x is input to the transmitting device 1. This input digital signal is divided into compressive sensing frames, and a single compressive sensing frame corresponds to a single input digital signal x. The input digital signal x is formed of a column of N data. The compressing unit 11 generates and outputs a compressed digital signal d that has been compressed, by converting the input digital signal x by using a Walsh function and extracting a specific frequency component therefrom (Step S101). This extraction of a specific frequency component means selectively picking out a specific frequency component. This specific frequency component is, for example, a signal component of a specific frequency domain including a natural frequency in monitoring of the natural frequency of a structure, or the like. In this first embodiment, the compressing unit 11 converts an input digital signal x by using an observation matrix $\Phi a$ (hereinafter, referred to as an extracted observation matrix $\Phi a$) corresponding to a Walsh function of a specific frequency component, and generates and outputs this converted digital signal as a compressed digital signal d. The compressed digital signal d has been compressed into a column of M (M<N) data. Thereafter, the transmitting unit 13 wirelessly transmits the generated compressed digital signal d (Step S102). Since the relation M<N holds, the transmitting device 1 wirelessly transmits M data, which are less than the N data wirelessly transmitted, and thus power consumption in the wireless transmission is able to be reduced.

As illustrated in FIG. 3, in the receiving device 2, the receiving unit 21 receives the compressed digital signal d transmitted from the transmitting device 1 (Step S201). Thereafter, the decompressing unit 22 executes a decompression process by using the extracted observation matrix $\Phi a$ and a basis transformation matrix $\Psi$ corresponding to inverse discrete Fourier transform, by use of, for example, L1-norm minimization or the like, and generates and outputs a decompressed digital signal x' (Step S202).

The decompressed digital signal x' is decompressed as N data, which are the same as the original input digital signal x, but has a decompression error, as will be described later. This decompression error is dependent on sparsity of the input digital signal x if conventional compressive sensing is used, and the decompression error becomes small when the sparsity is high and the decompression error becomes large when the sparsity is low.

In general, when the above described compressive sensing is used, a decompression error is generated with respect to the conventional compression technique of ZIP, LZH, or the like, and as compared with the conventional compression technique of ZIP, LZH, or the like, since the compression process is executed only by matrix product operation, power consumption in the compression operations becomes extremely small. In contrast, in compressive sensing, the decompression process becomes complicated and power consumption at the decompression side is generally increased. In general, in a transmitting and receiving system, such as a wireless sensing system, at the transmitting device 1 side, which is a wireless sensor node that executes a compression process, power consumption needs to be reduced with battery drive or the like, but since a receiving device 2 side, which executes a decompression process, is configured to be able to be sufficiently supplied with power, a compressive sensing technique that reduces the power consumption in the transmitting device 1 can be said to be suitable for the wireless sensing system.

Figure 4:
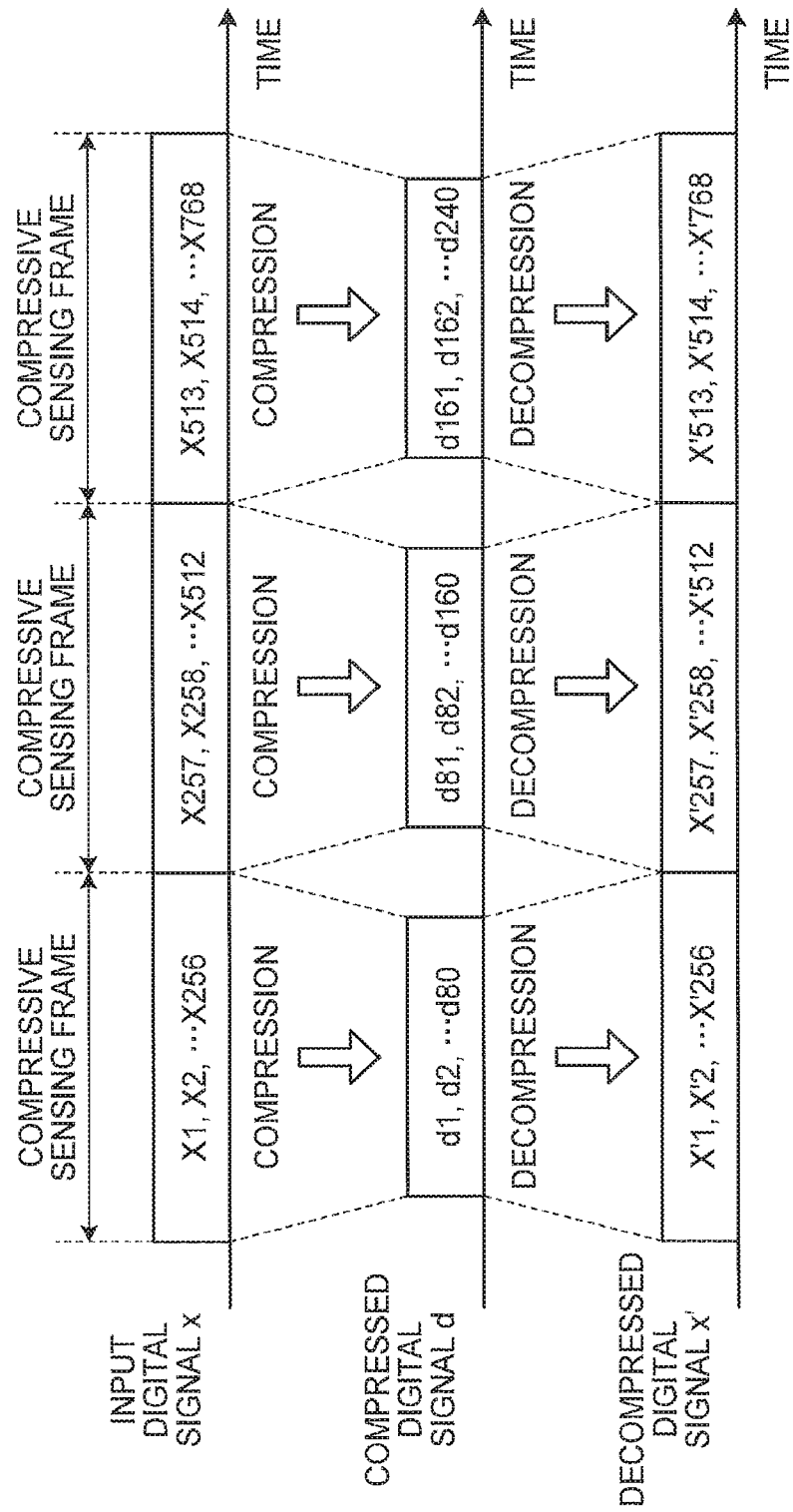
FIG. 4 is a time chart schematically illustrating an outline of specific signal processing in the first embodiment of this invention.

FIG. 4 is a time chart schematically illustrating an outline of specific signal processing in the first embodiment. As illustrated in FIG. 4, the input digital signal x is divided into, for example, N=256 compressive sensing frames. Thereafter, a compression process of each input digital signal x is executed for each compressive sensing frame by the compressing unit 11 for conversion into M=80 compressed digital signals d. Thereafter, a decompression process is executed by the decompressing unit 22 on the receiving device 2 side, and N decompressed digital signals x', as many as those before the compression, are generated. As described above, since M<N, wireless transmission power on the transmitting device 1 side is reduced.

FIG. 5 is a vector representation of the input digital signal x. Herein, the input digital signal x is represented as a column vector having the number of elements of N. FIG. 6 illustrates the extracted observation matrix $\Phi a$ used in the compression or decompression by the compressing unit 11 and the decompressing unit 22. In FIG. 6, the extracted observation matrix $\Phi a$ is expressed as a matrix of M rows and N columns. FIG. 7 is a vector representation of the compressed digital signal d. Herein, the compressed digital signal d is represented as a column vector having the number of elements of M, satisfying the relation, M<N. Data compression in the compressive sensing according to this first embodiment is implemented by a matrix operation expressed by Equation (3). Therefore, as compared with the conventional compression technique of ZIP, LZH, or the like, execution with simple operations is possible and the number of operations is M×N times.

$$d = \Phi a x \qquad (3)$$

FIG. 8 illustrates a matrix representation of the basis transformation matrix $\Psi$ used in the decompression process of the decompressing unit 22. Herein, the basis transformation matrix $\Psi$ is expressed as a matrix of N rows and N columns, and as will be described later, the decompressing unit 22 uses the basis transformation matrix Ψ corresponding to inverse discrete Fourier transform.

As illustrated in FIG. 1, the compressing unit 11 has an extracted observation matrix multiplying unit 12. The extracted observation matrix multiplying unit 12 multiplies the input digital signal x, which is a column of N data, by the extracted observation matrix Φa (matrix product operation) as expressed by Equation (3) and generates the compressed digital signal d, which is a column of M data. Therefore, the number of operations by the extracted observation matrix multiplying unit 12 becomes M×N.

The observation matrix Φ in the conventional compressive sensing uses, as described in the Sasaki document, a random matrix, in which each element is random, but in this first embodiment, compression is executed by converting the input digital signal x by use of the extracted observation matrix Φa corresponding to the Walsh function of the specific frequency component.

Next, with reference to FIG. 9 to FIG. 12, a sequence of generating the extracted observation matrix Φa from the Walsh function will be described. First, a Walsh function is a square wave function, in which a closed interval [0, 1] is equally divided into $2^n$, and a value of each interval is +1 or −1. The Walsh function is a complete orthonormal function system having characteristics similar to those of a trigonometric function, and is able to execute Walsh series expansion of an arbitrary waveform having a cycle, similarly to Fourier series expansion. The Walsh function is obtained by rearranging a Hadamard matrix. The Hadamard matrix is a square matrix, which is formed of two values of ±1 and has a size of $2^n \times 2^n$, and when a $2^n$-th order Hadamard matrix $H(2^n)$ is given, a $2^{n+1}$-th order Hadamard matrix $H(2^{n+1})$ is expressed as illustrated in FIG. 9. FIG. 10 illustrates generation of Hadamard matrices up to $2^3$-th order, which is specifically expressed with numerical values, based on the relation illustrated in FIG. 9. In this first embodiment, since N=256, although illustration thereof will be omitted, from $2^8$=256, a $2^8$-th order Hadamard matrix is applied.

Figure 11:
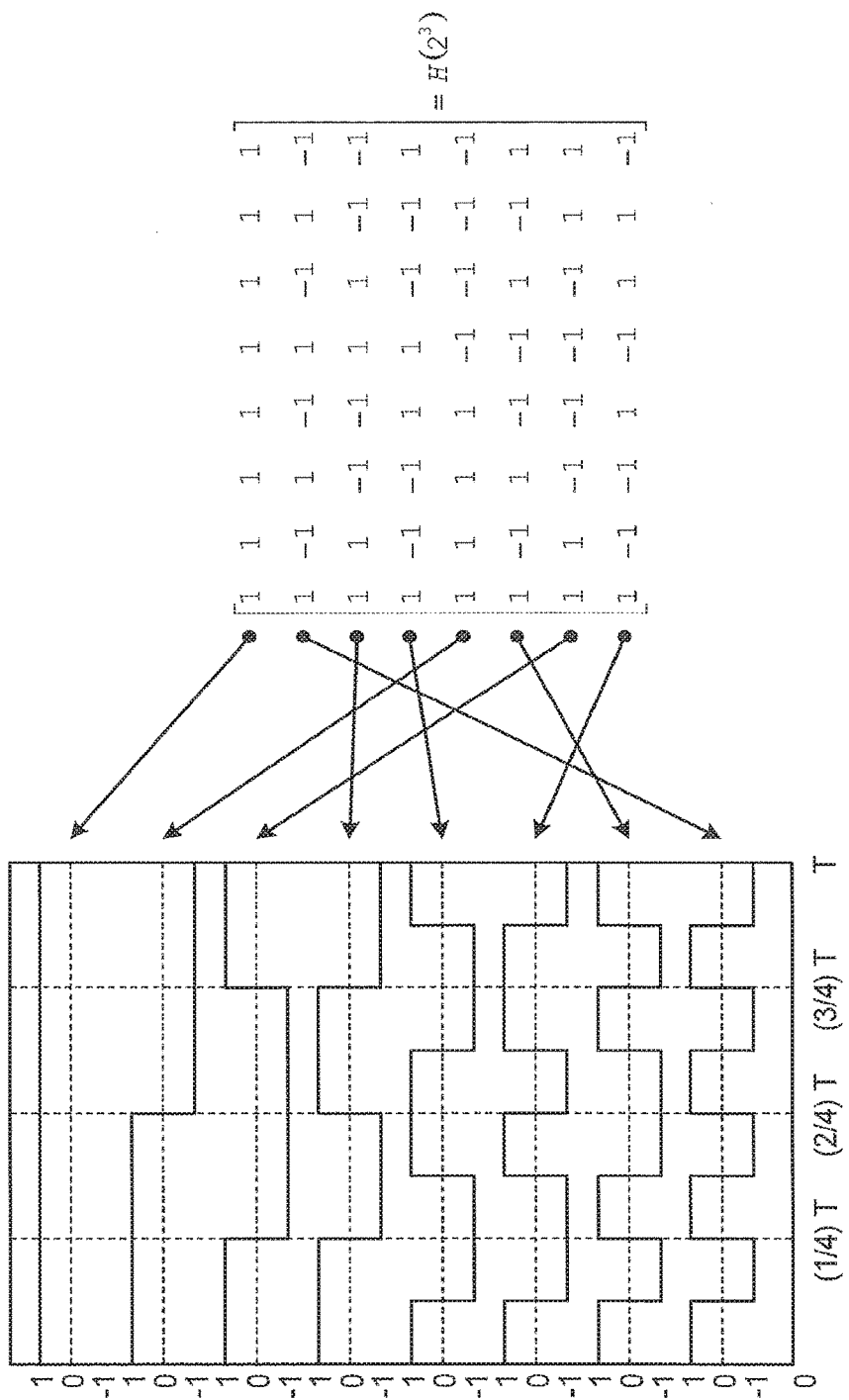
FIG. 11 is a diagram illustrating a relation between a $2^3$-th order Hadamard matrix and a Walsh function corresponding to this Hadamard matrix.

A Walsh function is obtained by rearranging series of respective rows of the Hadamard matrix $H(2^n)$ in order of their numbers of intersections. The number of intersections is the number of times the values in the series of each row change from +1 to −1, or from −1 to +1. In the Walsh function, in ascending order of the numbers of intersections, rows generally corresponding to a sin wave and a cos wave of Fourier series appear, and frequency corresponding thereto is increased. The first row corresponds to direct current. FIG. 11 illustrates a $2^3$-th order Hadamard matrix, and a Walsh function (waveform wal(k, t/T), where k is the number of intersections) corresponding to this Hadamard matrix. In this first embodiment, a $2^8$-th order Walsh function not illustrated is used.

FIG. 12 is a diagram schematically illustrating a method of generating the extracted observation matrix Φa extracting a specific frequency component from the observation matrix Φ corresponding to the Walsh function. The specific frequency component is set around a natural frequency of a structure for health monitoring of the structure, for example. In this first embodiment, since the natural frequency of the structure is at around 4 Hz, the specific frequency component is set at 2 Hz to 5 Hz.

A method of extracting a specific frequency component from a Walsh function is to selectively pick out rows corresponding to the specific frequency component. For example, if a sampling frequency fs of analog/digital conversion in this first embodiment is 20 Hz, in a Walsh function, the first row corresponds to 0 Hz, and the last row, that is, the N-th row, corresponds to (N/2)/(N/fs)=fs/2 Hz. Therefore, in this first embodiment, the N-th row corresponds to 20/2=10 Hz. Since cycles included in each row increase by one every two rows, the 2i-th and (2i+1)-th rows correspond to i/(N/fs) Hz. In this first embodiment, since N=256, they correspond to i/12.8 Hz. Therefore, rows corresponding to 2 Hz are, by solving i/12.8=2, =25.6 and 2i=51.2, but since the 50th row and the 51st row represent the same frequency, rows from the 50th row correspond thereto. Further, rows corresponding to 5 Hz are, by solving i/12.8=5, since i=64 and 2i+1=129, rows up to the 129th row. Therefore, the rows corresponding to 2 HZ to 5 Hz are the 80 rows from the 50th to 129th rows, and by extracting these 80 rows from the observation matrix Φ corresponding to the Walsh function, the extracted observation matrix Φa is found.

In FIG. 12, the initial row of the observation matrix Φ is the k-th row of the Walsh function, and M represents the number of rows of the observation matrix Φ. Therefore, in the extracted observation matrix Φa of this first embodiment, k=50, and M=80. Since the number of data after the compression by the compressing unit 11 is M=80, the compression ratio becomes 80/256=31(%) and the original input digital signal x is compressed to equal to or less than ⅓.

Figure 13:
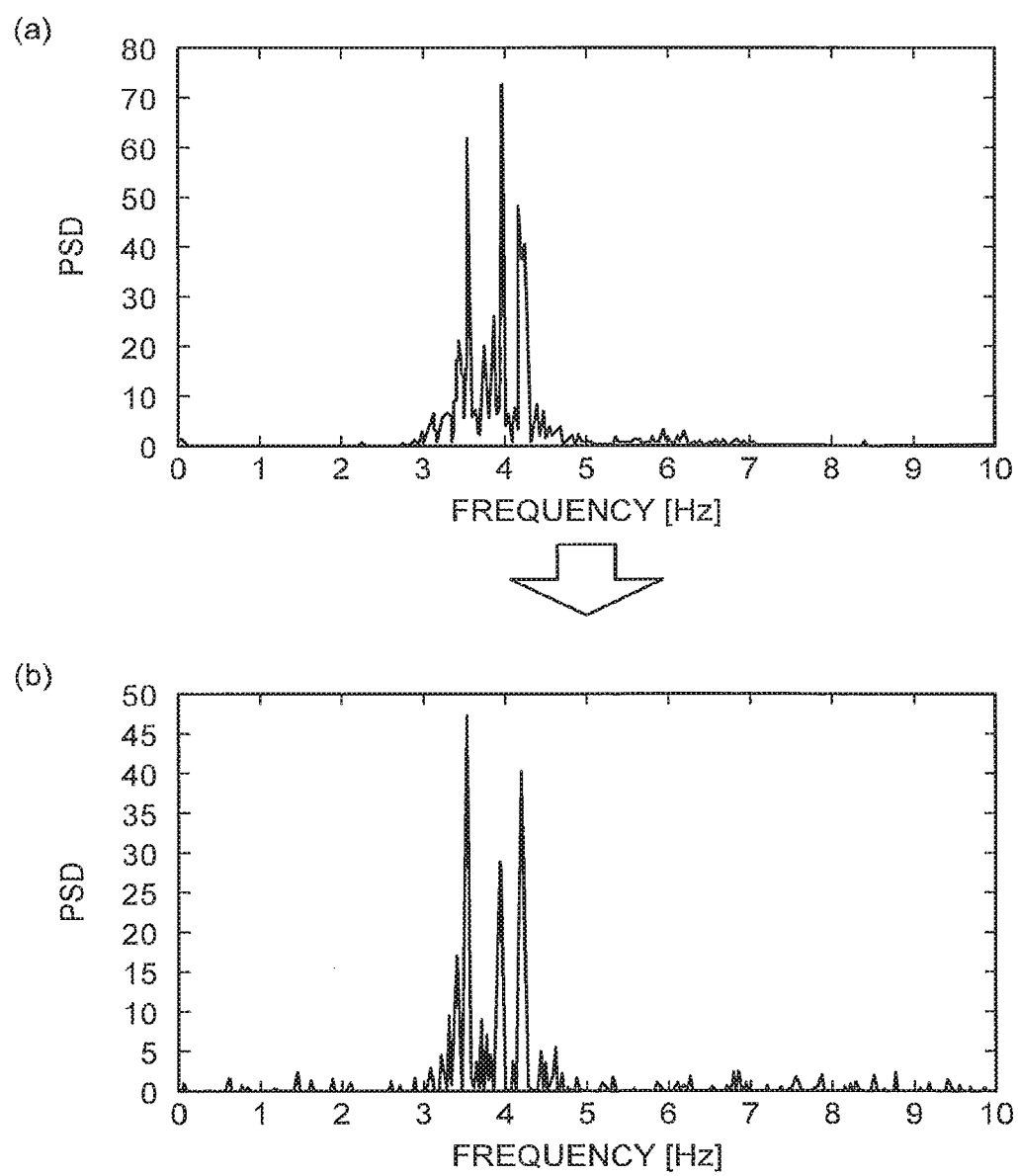
FIG. 13 is a power spectra diagram of vibration of an expressway elevated bridge, before compression and after decompression, when conventional compressive sensing using a random matrix as an observation matrix is applied.

FIG. 13 illustrates power spectra of vibration (acceleration) of an expressway elevated bridge, before compression and after decompression, when conventional compressive sensing using a random matrix as an observation matrix is applied. That is, in FIG. 13, the horizontal axis represents the frequency, and the vertical axis represents the power spectral density (PSD). The sampling frequency of the analog/digital conversion is 20 Hz, the upper figure (FIG. 13(a)) illustrates the power spectrum of the original data before the compression, and the lower figure (FIG. 13(b)) illustrates the power spectrum after the decompression. This example is an example of a case where sparsity of the original input digital signal x is low, and on each of both sides of 4 Hz, the natural frequency of the elevated bridge, for example, a comparatively large peak is present. In view of the power spectrum after the decompression, it is understood that the peak at 4 Hz, the natural frequency that needs to be decompressed, has become small and the peaks on both sides thereof have been emphasized. As described above, in the conventional compressive sensing, when sparsity of the input digital signal x is low, the decompression error is increased.

Figure 14:
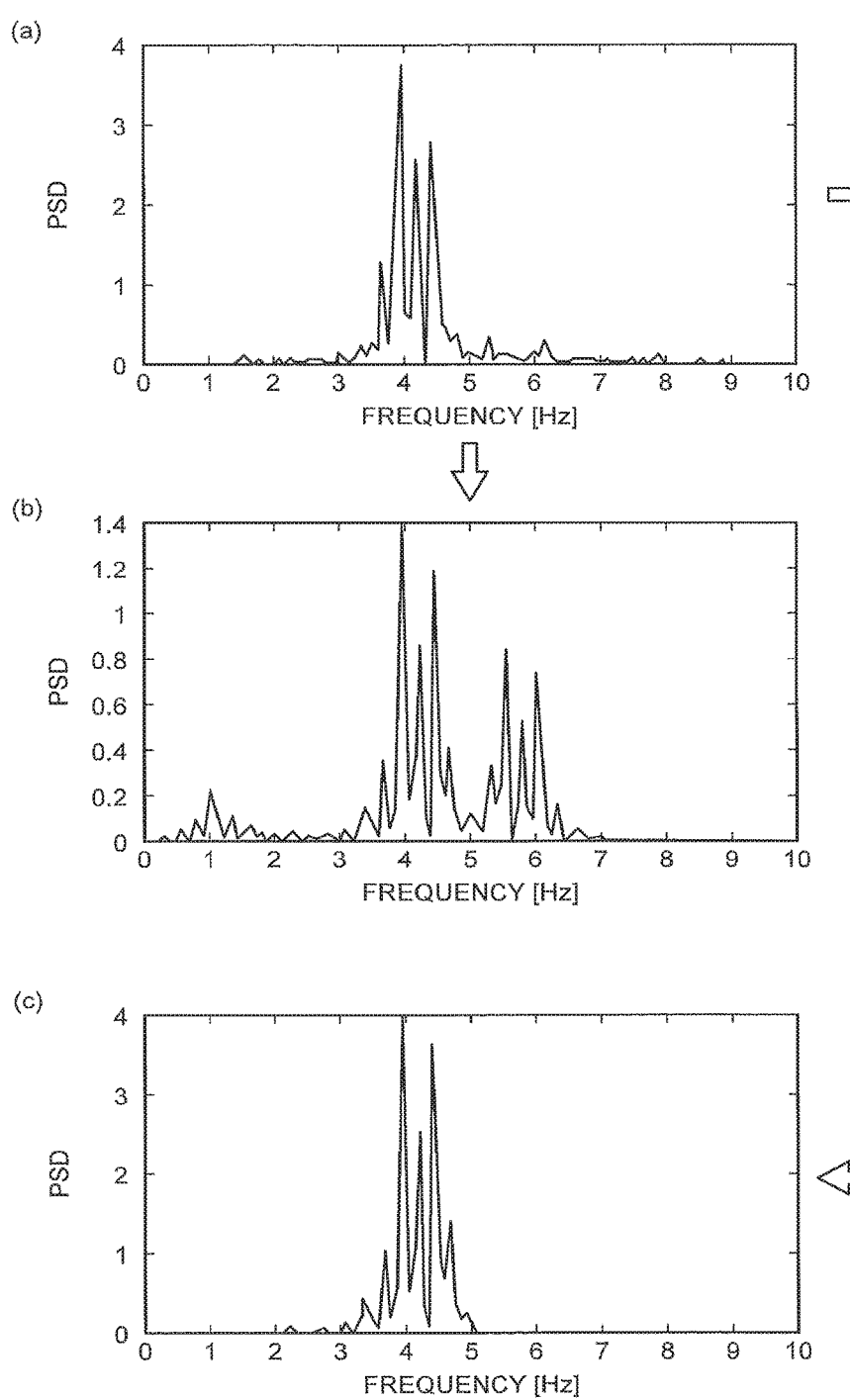
FIG. 14 illustrates a power spectra diagram for a case where an input digital signal of vibration of the same expressway elevated bridge as that of FIG. 13 is compressed and decompressed by use of an extracted observation matrix corresponding to a Walsh function according to this first embodiment. The upper figure (FIG. 14(a)) is a power spectrum of the original input digital signal before the compression, the middle figure (FIG. 14(b)) is a power spectrum for a case where decompression is executed by inverse Walsh transform, as will be described later, and the lower figure (FIG. 14(c)) is a power spectrum for a case where decompression is executed by use of the basis transformation matrix $\Psi$ corresponding to inverse discrete Fourier transform described later.

In contrast, FIG. 14 illustrates power spectra in a case where an input digital signal x of vibration (acceleration) of the same expressway elevated bridge is compressed and decompressed by use of the extracted observation matrix Φa corresponding to the Walsh function according to this first embodiment. The sampling frequency of the analog/digital conversion is 20 Hz, the upper figure (FIG. 14(a)) is a power spectrum of the original input digital signal x before the compression, the middle figure (FIG. 14(b)) is a power spectrum for a case where decompression is executed by inverse Walsh transform, as will be described later, and the lower figure (FIG. 14(c)) is a power spectrum for a case where decompression is executed by use of the basis transformation matrix Ψ corresponding to inverse discrete Fourier transform described later. When FIG. 14(a) and FIG. 14(c) are compared with each other, the original input digital signal x has three large peaks and again has low sparsity, but the peak at the natural frequency, 4 Hz, which is the largest in the data represented by the original input digital signal x before the compression, has been decompressed still as the largest peak even after the decompression in contrast to FIG. 13, and thus it is understood that when compression using the extracted observation matrix Φa is executed, the decompression accuracy is increased.

That is, as compared with the case where the compression and decompression are executed by application of the conventional compressive sensing using a random matrix as the observation matrix as described in the Sasaki document, by the compression and decompression executed with the extracted observation matrix Φa utilizing the Walsh function according to this first embodiment, application is possible even if the sparsity is low and the decompression accuracy is able to be increased. In particular, in this first embodiment, it is understood that, as compared with the conventional compressive sensing technique limited to the case where the sparsity is high, the application range is widened. That is, for use requiring accurate decompression of a specific frequency range around a natural frequency like in health monitoring of a structure, this first embodiment is preferably applied thereto.

Further, in this first embodiment, since the extracted observation matrix Φa corresponding to the Walsh function is generated from the elements, ±1, the matrix product operation of Equation (3) is realized by execution of addition and subtraction only. Therefore, since product-sum operations like in the case where fast Fourier transform (FFT), which is used in Patent Literature 1, is used are not required, the power consumed by the operations at the transmitting device 1 side is able to be reduced largely.

In this first embodiment, since compression is executed with the extracted observation matrix Φa corresponding to the Walsh function, one may consider using inverse Walsh transform using the extracted observation matrix Φa upon decompression. However, according to investigations by the inventors, as illustrated in FIG. 14(b), it has been found that when decompression is executed by use of inverse Walsh transform, at 2 Hz and 5 Hz, which are boundaries of the specific frequency domain, returning of the decompressed waveform occurs. Specifically, from FIG. 14(b), it is understood that three large peaks that are present at 4 Hz to 5 Hz have been generated at 5 Hz to 6 Hz by being returned with 5 Hz being the turning point. Further, from the vertical axis, it is understood that the power spectral density of each peak has become smaller than that in FIG. 14(a). Specifically, for the power spectral density of the largest peak at 4 Hz, the value of about 3.8 in FIG. 14(a) has become as small as about 1.4 in FIG. 14(b). This is considered to be caused by dispersion of energy, since the waveform is returned and decompressed to a portion at other frequency. Therefore, reproducibility of the power spectral density on the vertical axis is poor.

In contrast, when decompression is executed by use of the basis transformation matrix Ψ corresponding to inverse discrete Fourier transform, as illustrated in FIG. 14(c), returning is not caused, the power spectral density on the vertical axis is about 3.9, and decompression to the original data is substantially achieved. Therefore, more highly accurate decompression is possible when the decompression process is implemented by use of the basis transformation matrix Ψ corresponding to inverse discrete Fourier transform.

FIG. 15 illustrates this basis transformation matrix Ψ. The basis transformation matrix Ψ is found as follows. First, by using the vector x and the vector s of Equation (2), inverse discrete Fourier transform is able to be expressed by the following Equation (4).

$$x_i = \frac{1}{N} \sum_{n=0}^{N-1} s_n e^{\frac{2\pi j}{N} ni} \quad (4)$$

Herein, xi and sn are respectively an i-th element of the vector x and an n-th element of the vector s. Therefore, the basis transformation matrix Ψ corresponding to inverse discrete Fourier transform is as illustrated in FIG. 15.

Second Embodiment

Next, a second embodiment of this invention will be described. In the above described first embodiment, the compressing unit 11 executes compression by multiplying the input digital signal x by the extracted observation matrix Φa, but the compressing unit 11 of this second embodiment first executes fast Walsh-Hadamard transform, and wirelessly transmits a portion corresponding to a specific frequency portion picked out from the converted digital signal as the compressed digital signal d.

Figure 16:
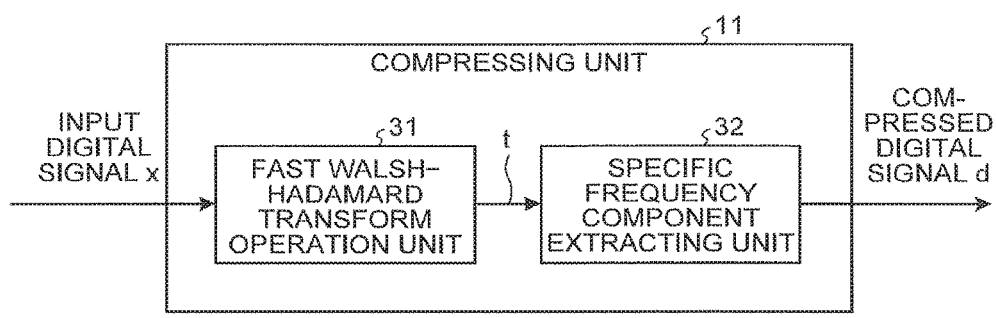
FIG. 16 is a block diagram illustrating a configuration of a compressing unit of a transmitting and receiving system of a second embodiment of this invention.

FIG. 16 is a block diagram illustrating a configuration of the compressing unit 11 of a transmitting and receiving system, which is the second embodiment. This compressing unit 11 has a fast Walsh-Hadamard transform operation unit 31 and a specific frequency component extracting unit 32.

The fast Walsh-Hadamard transform operation unit 31 executes fast Walsh-Hadamard transform of an input digital signal x. Fast Walsh-Hadamard transform is a process of executing arithmetic processing of a Walsh function with a small number of operations. In this fast Walsh-Hadamard transform, butterfly operations that are the same as those of fast Fourier transform (FFT) are executed. Therefore, in this second embodiment, by the specific frequency component extracting unit 32 thereafter picking out a portion corresponding to a specific frequency component from a converted digital signal that has been subjected to fast Walsh-Hadamard transform, completely the same result as that in the case where the compression is executed with the extracted observation matrix Φa corresponding to the Walsh function described in the first embodiment is obtained with a small number of operations.

Figure 17:
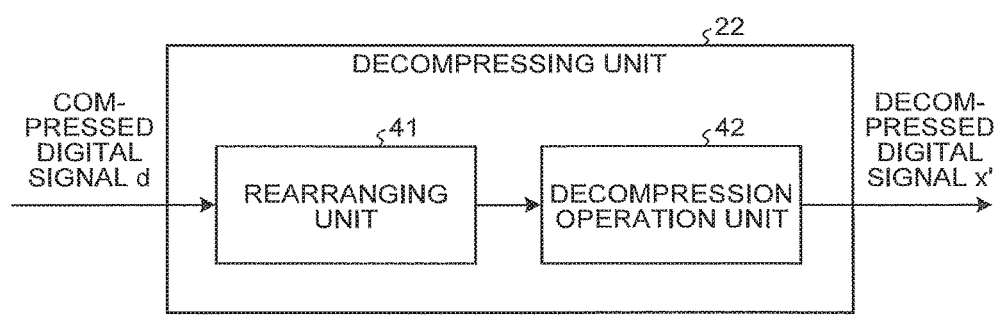
FIG. 17 is a block diagram illustrating a configuration of a decompressing unit of the transmitting and receiving system of the second embodiment of this invention.

FIG. 17 is a block diagram illustrating a configuration of the decompressing unit 22 of the transmitting and receiving system, which is the second embodiment. The specific frequency component extracting unit 32 of the compressing unit 11 outputs the extracted specific frequency component as it is without rearranging its frequency order. Therefore, in the decompressing unit 22 of the second embodiment, a rearranging unit 41 is provided upstream of a decompression operation unit 42 having the same function as the decompressing unit 22 of the first embodiment. The rearranging unit 41 then rearranges the input compressed digital signal d in the frequency order of the Walsh function and outputs the rearranged compressed digital signal d to the decompression operation unit 42.

Figure 18:
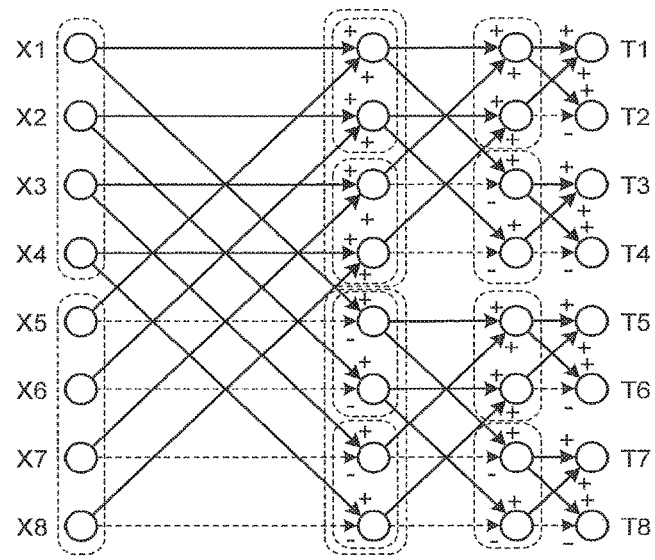
FIG. 18 is a diagram illustrating a signal flow of fast Walsh-Hadamard transform algorithm.

FIG. 18 illustrates a signal flow of fast Walsh-Hadamard transform algorithm. In FIG. 18, as an example, fast Walsh-Hadamard transform algorithm in the case of the $2^3$-th order is illustrated and the number N of data of the input digital signal x equals 8. In the figure, the leftmost column represents this input digital signal x (X1, X2, X3, X4, X5, X6, X7, and X8). Firstly, in a first stage, data of the leftmost column are divided into two groups, (X1, X2, X3, and X4) and (X5, X6, X7, and X8). Addition and subtraction between the head data, X1 and X5, the second data, X2 and X6, the third data, X3 and X7, and the fourth data X4 and X8, of these groups are executed to generate the data of the second column. Next, the data of the second column are further divided into two such that the data are divided into four groups, each group being formed of two data. Then, addition and subtraction are executed in order from between the head datum of the first group and the head datum of the second group, and so on, to generate data of the third column. Lastly, the data of the third column are further divided into two to obtain eight data, each datum being independent, and addition and subtraction are executed in order from the head datum and the second datum, the third datum and the fourth datum, and so on, to generate data of the fourth column, which are output data. That is, by executing butterfly operations of fast Walsh-Hadamard transform with respect to the input digital signal x (X1 to X8), a converted digital signal t (T1 to T8) is output.

The number of operations of fast Walsh-Hadamard transform in this case is, at each stage, N=8 times and the number of stages is (Log 2)8=3. Therefore, in this second embodiment, the number of operations is able to be reduced, as compared to the first embodiment. Specifically, in the first embodiment, since the matrix product of Equation (3) is calculated, the number of operations becomes N×M, while in this embodiment, the number of operations becomes N×(Log 2)N. In the first embodiment, the example in which N=256 and M=80 is described, and the number of operations in this case is 256×80=20,480 times, while in the second embodiment, 256×(Log 2)256=256×8=2,048, and thus it is understood that reduction to 1/10 is able to be achieved.

Figure 19:
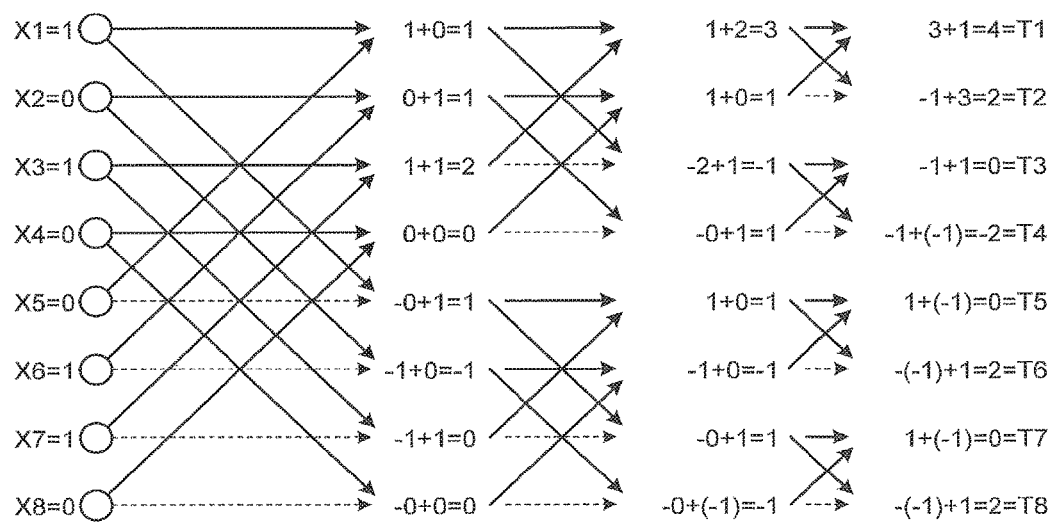
FIG. 19 is a diagram illustrating a specific example of fast Walsh-Hadamard transform.

Further, FIG. 19 illustrates a specific example of fast Walsh-Hadamard transform. For the input digital signal x illustrated in FIG. 18, the number of data N=8, and the elements are 1, 0, 1, 0, 0, 1, 1, and 0 in this order. In FIG. 19, the course of butterfly operations for three-stage addition and subtraction is specifically illustrated, and it is understood that 4, 2, 0, −2, 0, 2, 0, and 2 are obtained as the final output.

As illustrated in FIG. 18 and FIG. 19, the number of outputs of the converted digital signal t after fast Walsh-Hadamard transform is still N=8 and is the same as the number of the input digital signal x. The specific frequency component extracting unit 32 then extracts only a portion corresponding to a specific frequency domain from a result of the operations of fast Walsh-Hadamard transform to realize data compression.

Figure 20:
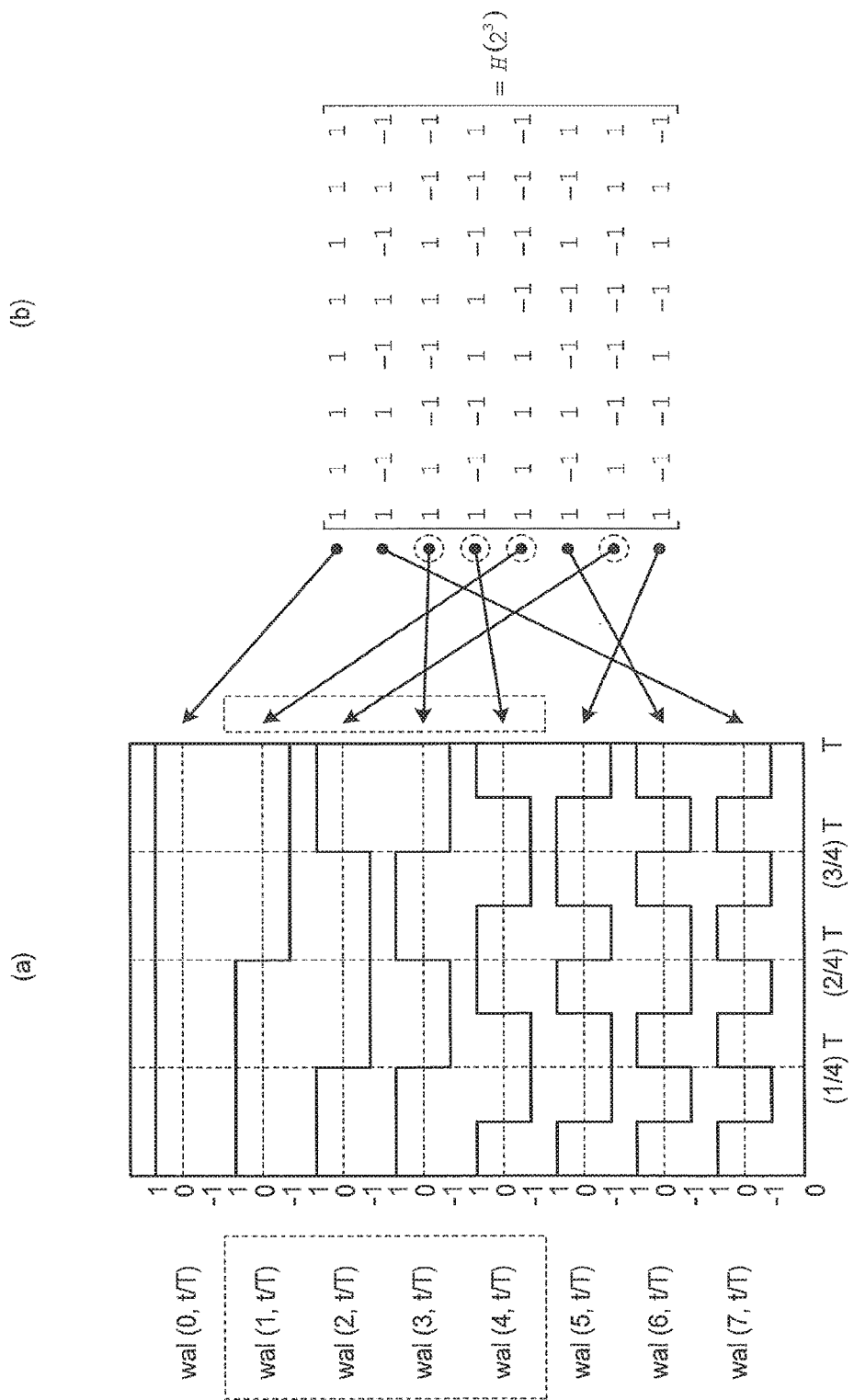
FIG. 20 is an explanatory diagram schematically illustrating an extraction process by a specific frequency component extracting unit.

FIG. 20 is an explanatory diagram schematically illustrating an extraction process by the specific frequency component extracting unit 32. FIG. 20 illustrates a case of the $2^3$-th order as an example. The matrix on the right in the figure (FIG. 20(b)) illustrates a Hadamard matrix equivalent to fast Walsh-Hadamard transform. The matrix on the left in the figure (FIG. 20(a)) illustrates a Walsh function corresponding thereto. The arrows between FIG. 20(a) and FIG. 20(b) illustrate correspondence between the respective rows.

The second to fifth rows surrounded by a rectangle in FIG. 20(a) are rows corresponding to a specific frequency domain desired to be extracted. It is understood that rows of the matrix of FIG. 20(b) corresponding to these rows are the 3rd, 4th, 5th, and 7th rows. FIG. 21 is a diagram illustrating an example of extraction data specifying this specific frequency desired to be extracted. In the extraction data illustrated in FIG. 21, the 3rd, 4th, 5th, and 7th elements are made "1" to indicate the ordering of elements desired to be extracted, and the other elements are made "0" to indicate the ordering of elements not to be extracted. The specific frequency component extracting unit 32 extracts only a specific frequency domain including a natural frequency, for example, by holding the extraction data illustrated in FIG. 20 beforehand. By executing this extraction of the specific frequency component by the specific frequency component extracting unit 32, the compressing unit 11 is able to output the input digital signal x as the compressed digital signal d that has been compressed.

The natural frequency of a structure is able to be identified by measuring it beforehand, and even if the natural frequency changes due to damage or the like of the structure, the amount of that change is limited, and thus, the specific frequency domain desired to be extracted is able to be held beforehand as the extraction data, the specific frequency domain may be a small domain, and data are able to be compressed widely.

The rearranging unit 41 of the decompressing unit 22 executes a process of rearranging the compressed digital signal d extracted with the extraction data of FIG. 21, in the original order of the Walsh function. As illustrated in FIG. 20, the matrix of FIG. 20(b) illustrates the Hadamard transform matrix that has been subjected to fast Walsh-Hadamard transform, the rows surrounded by broken-lined circles therein are the rows corresponding to the extracted specific frequency domain, and the arrows in the middle each indicate which one of the area surrounded by the broken-lined rectangle corresponding to the specific frequency of the left matrix representing the Walsh function each of these rows corresponds to. Accordingly, it is understood that the uppermost one of the portion surrounded by the broken-lined circles in the right matrix corresponds to the third one of the portion surrounded by the broken-lined rectangle in the left matrix, the second one of the right to the fourth one of the left, the third one of the right to the first one of the left, and the fourth one of the right to the second one of the left.

Therefore, the rearranging unit 41 holds rearrangement data as illustrated in FIG. 22, and, based on the rearrangement data, rearranges the compressed digital signal d in the frequency order of the Walsh function. The rearrangement data illustrated in FIG. 22 are "3, 4, 1, 2", and these values indicate that the first one of the input compressed digital signal corresponds to the third one of the original Walsh function, the second one to the fourth one, the third one to the first one, and the fourth one to the second one. By using the rearrangement data, the process of rearranging the data that have been subjected to fast Walsh-Hadamard transform in the original order of the Walsh function is able to be executed.

The decompression operation unit 42 executes the same process as the decompressing unit 22 of the first embodiment. That is, the decompression operation unit 42 is able to output the decompressed digital signal x' by executing data decompression by L1-norm minimization or the like by use of the extracted observation matrix Φa and the basis transformation matrix Ψ with respect to the rearranged data, similarly to the first embodiment. If the decompression process using the basis transformation matrix Ψ corresponding to inverse discrete Fourier transform is executed, even more accurate decompression is achieved.

Figure 23:
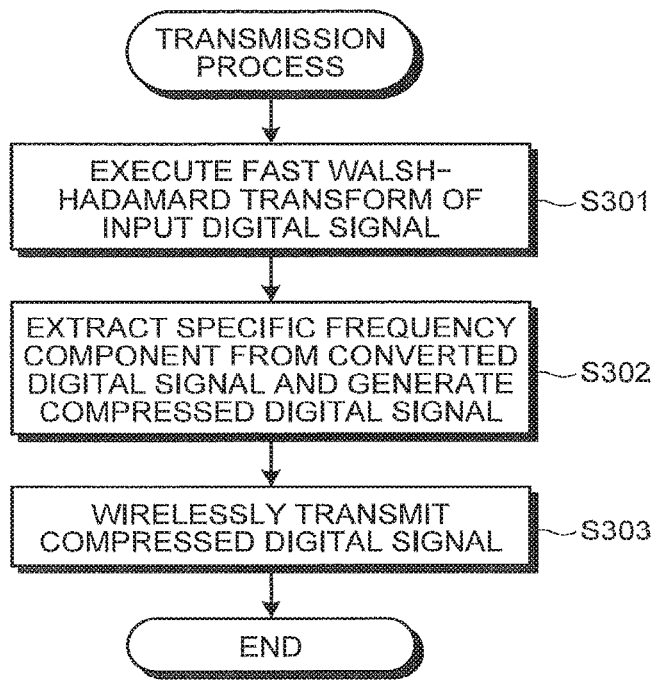
FIG. 23 is a flow chart illustrating a transmission procedure of a transmitting device according to the second embodiment.

With reference to flow charts illustrated in FIG. 23 and FIG. 24, a transmission procedure by the transmitting device 1 and a reception procedure by the receiving device 2 according to the second embodiment will be described. First, the transmission procedure by the transmitting device 1 will be described. As illustrated in FIG. 23, the fast Walsh-Hadamard transform operation unit 31 of the compressing unit 11 executes fast Walsh-Hadamard transform of the input digital signal x (Step S301). Thereafter, the specific frequency component extracting unit 32 generates the compressed digital signal d by extracting a specific frequency component from the converted digital signal t, which has been subjected to fast Walsh-Hadamard transform (Step S302). The transmitting unit 13 then wirelessly transmits this compressed digital signal d (Step S303) and ends this process.

Figure 24:
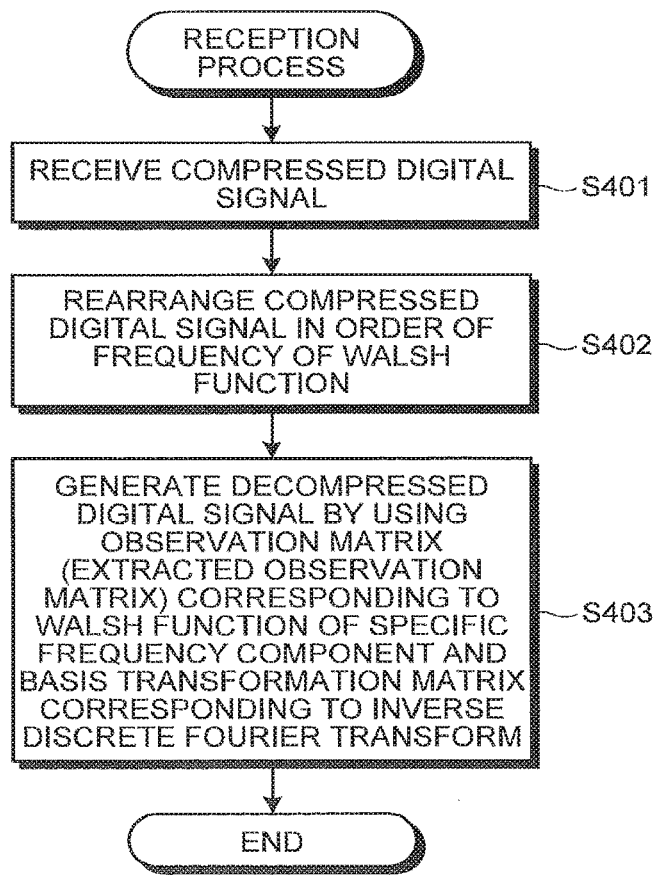
FIG. 24 is a flow chart illustrating a reception procedure of a receiving device according to the second embodiment.

In the receiving device 2, as illustrated in FIG. 24, the receiving unit 21 receives the compressed digital signal d (Step S401). Thereafter, the rearranging unit 41 rearranges this compressed digital signal d in the frequency order of the Walsh function (Step S402). Thereafter, the decompression operation unit 42 generates the decompressed digital signal x' by using the extracted observation matrix $\Phi a$, which is the observation matrix corresponding to the Walsh function of the specific frequency component, and the basis transformation matrix $\Psi$ corresponding to inverse discrete Fourier transform (Step S403), and ends this process.

The rearranging unit 41 is provided on the decompressing unit 22 side in order to reduce the processing of the compressing unit 11 installed on the transmitting device 1 side as much as possible to lower the power consumption at the transmitting device 1 side. Even if the rearranging unit 41 is provided in the decompressing unit 22, at the receiving device 2 side of the wireless sensing system or the like, sufficient power supply is able to be received in general. Of course, the rearranging unit 41 may be provided in the compressing unit 11 at the transmitting device 1 side.

Further, in this second embodiment, since fast Walsh-Hadamard transform is executed, a memory capacity needed for arithmetic operations by the compressing unit 11 is able to be reduced. In the first embodiment, the extracted observation matrix $\Phi a$ of M rows and N columns needs to be held on the memory, and the required memory capacity corresponds to about M×N. In the second embodiment, since the extracted observation matrix $\Phi a$ does not need to be held on a memory, the approximate required memory capacity corresponds to N memories storing the digital signal x and N memories for data for extracting the specific frequency component, requiring only a total of 2×N memories. In general, since M>>2, as compared to the first embodiment, the required memory capacity is able to be reduced largely, and the transmitting device 1 side, such as the wireless sensor node, is able to be designed to consume even less power.

In the second embodiment, when fast Walsh-Hadamard transform algorithm is executed, since input data are able to be sequentially replaced with data that have been subjected to arithmetic operation, a memory storing the operated data does not need to be separately prepared, and as described above, operations are able to be executed with about 2×N memories.

Third Embodiment

Next, a third embodiment of this invention will be described. In this third embodiment, the compression process and decompression process described in the first embodiment that achieve accurate decompression even if the sparsity is low, and the conventional compression process and decompression process that achieve accurate decompression when the sparsity is high, are made to be able to be switched over therebetween.

Figure 25:
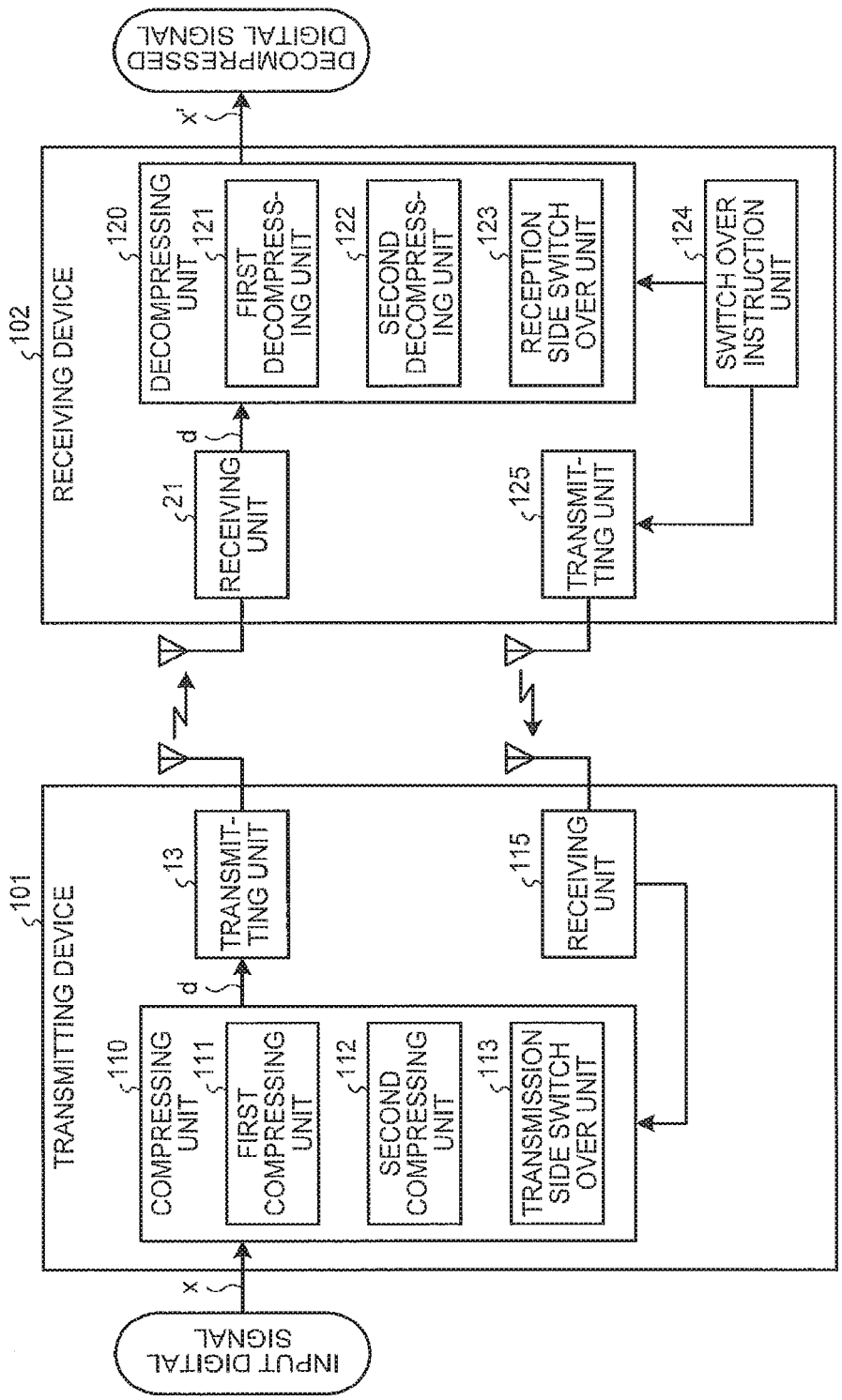
FIG. 25 is a block diagram illustrating a schematic configuration of a transmitting and receiving system of a third embodiment of this invention.

FIG. 25 is a block diagram illustrating a schematic configuration of a transmitting and receiving system, which is the third embodiment. It is different from the transmitting and receiving system described in the first embodiment in that a compressing unit 110 corresponding to the compressing unit 11 has a first compressing unit 111, a second compressing unit 112, and a transmission side switch over unit 113. The transmission side switch over unit 113 causes a compression process with respect to an input digital signal x to be processed by switching over between a compression process by the first compressing unit 111 and a compression process by the second compressing unit 112. Further, a decompressing unit 120 corresponding to the decompressing unit 22 has a first decompressing unit 121, a second decompressing unit 122, and a reception side switch over unit 123. The reception side switch over unit 123 causes a decompression process with respect to an input compressed digital signal d to be processed by switching over between a decompression process by the first decompressing unit 121 and a decompression process by the second decompressing unit 122.

The first compressing unit 111 corresponds to the compressing unit 11 of the first embodiment. Further, the first decompressing unit 121 corresponds to the decompressing unit 22 of the first embodiment. The second compressing unit 112 executes the compression process of the input digital signal x by using a random matrix as the observation matrix $\Phi$ (hereinafter, referred to as the random observation matrix $\Phi$). Furthermore, the second decompressing unit 122 executes the decompression process by using the random observation matrix $\Phi$.

Further, a receiving device 102 corresponding to the receiving device 2 has a switch over instruction unit 124. The switch over instruction unit 124 sends out a switch over instruction signal to the transmission side switch over unit 113 and sends out the switch over instruction signal to the reception side switch over unit 123, via a transmitting unit 125 provided in the receiving device 102 and a receiving unit 115 provided in a transmitting device 101. This switch over instruction signal is associated with execution of a switch over instruction for the decompression process by the first decompressing unit 121 if the switch over instruction signal indicates a switch over instruction for the compression process by the first compressing unit 111. Further, the switch over instruction signal is associated with execution of a switch over instruction for the decompression process by the second decompressing unit 122 if the switch over instruction signal indicates a switch over instruction for the compression process by the second compressing unit 112.

Figure 26:
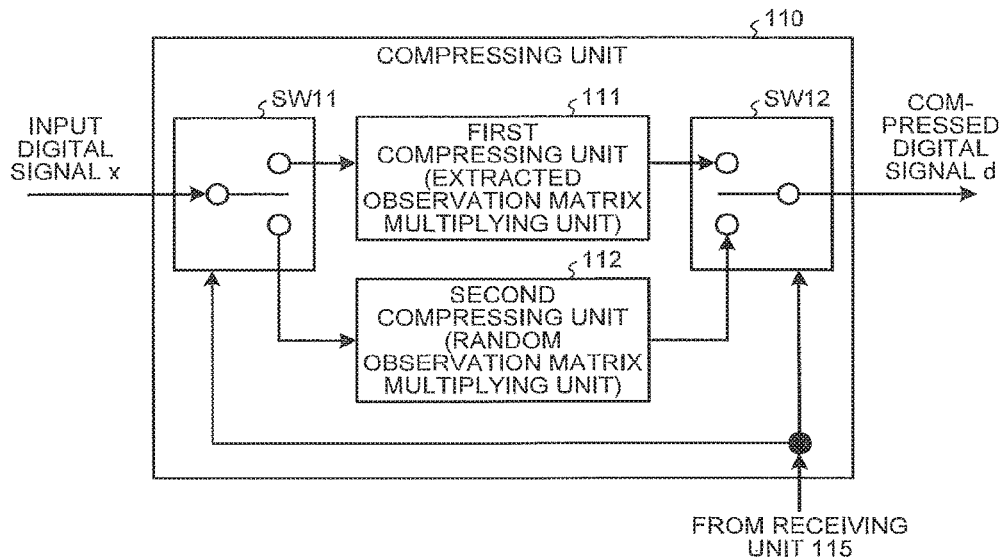
FIG. 26 is a block diagram illustrating a detailed configuration of a compressing unit according to the third embodiment.

FIG. 26 is a block diagram illustrating a detailed configuration of the compressing unit 110. As illustrated in FIG. 26, the compressing unit 110 has switches SW11 and SW12 respectively provided upstream of and downstream from the first compressing unit 111 and the second compressing unit 112 that are arranged in parallel with each other. The switches SW11 and SW12 form the transmission side switch over unit 113. The switches SW11 and SW12 execute, based on the switch over instruction signal input via the receiving unit 115, switch over between connection to the first compressing unit 111 and connection to the second compressing unit 112, in synchronization therewith.

Figure 27:
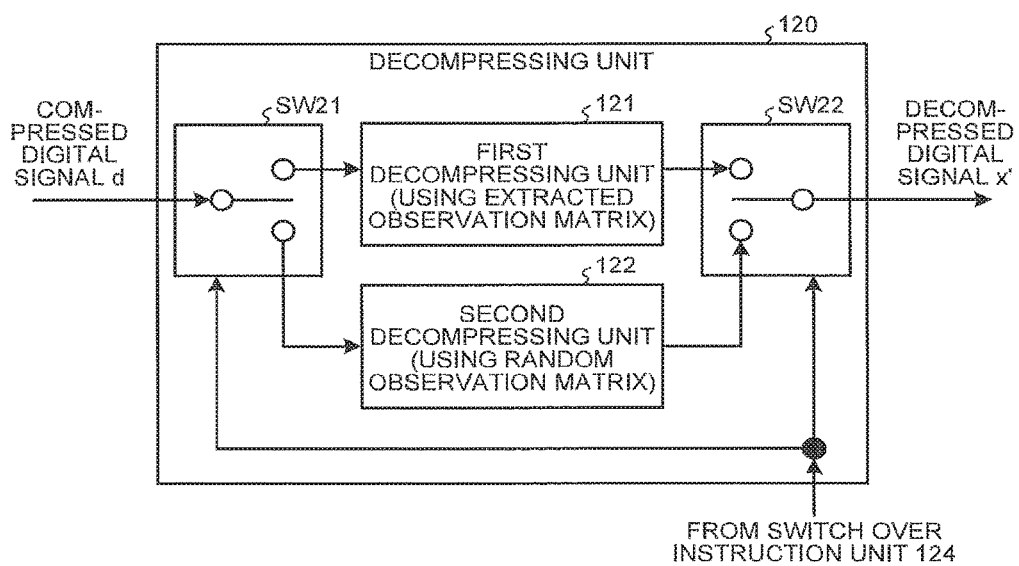
FIG. 27 is a block diagram illustrating a detailed configuration of a decompressing unit according to the third embodiment.

FIG. 27 is a block diagram illustrating a detailed configuration of the decompressing unit 120. As illustrated in FIG. 27, the decompressing unit 120 has switches SW21 and SW22 respectively provided upstream of and downstream from the first decompressing unit 121 and the second decompressing unit 122 that are arranged in parallel with each other. The switches SW21 and SW22 form the reception side switch over unit 123. The switches SW21 and SW22 execute, based on the switch over instruction signal input via the switch over instruction unit 124, switch over between connection to the first decompressing unit 121 and connection to the second decompressing unit 122, in synchronization therewith.

The switch over instruction unit 124 functions as an operation input unit, and is able to execute, based on the decompressed state of the decompressed digital signal x', a switch over instruction between the compression and decompression processes by the first compressing unit 111 and the first decompressing unit 121, and the compression and decompression processes by the second compressing unit 112 and the second decompressing unit 122.

Figure 28:
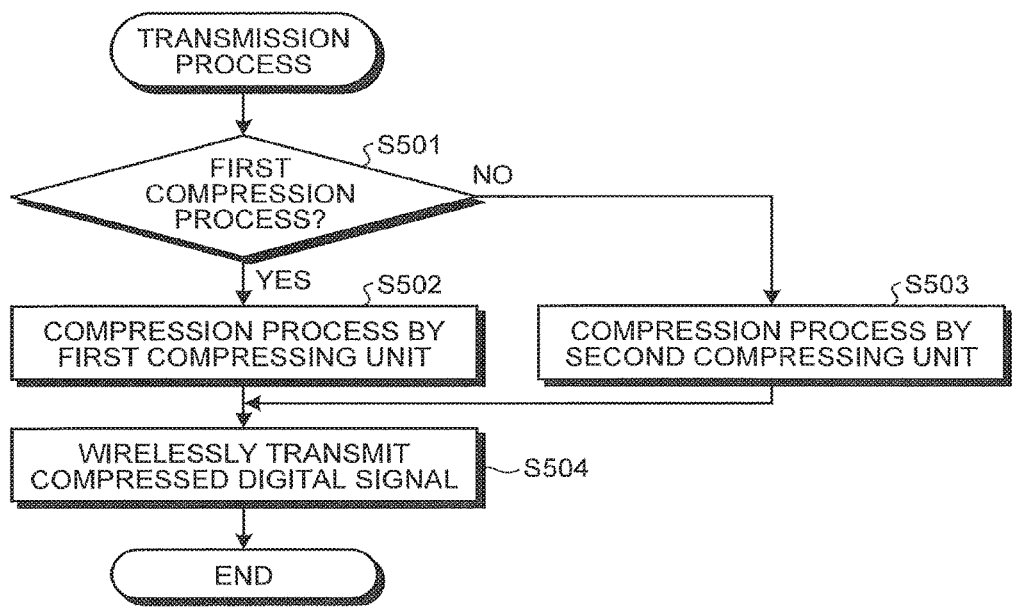
FIG. 28 is a flow chart illustrating a transmission procedure of a transmitting device according to the third embodiment.

With reference to flow charts illustrated in FIG. 28 and FIG. 29, a transmission procedure of the transmitting device 1 and a reception procedure of the receiving device 2, according to the third embodiment will be described. First, the transmission procedure by the transmitting device 1 will be described. As illustrated in FIG. 28, the transmitting device 1 determines whether or not a switch over instruction signal instructing a first compression process has been input (Step S501). If the switch over instruction signal instructs the first compression process (Step S501: Yes), the switches SW11 and SW12 are connected to the first compressing unit 111 and the compression process by the first compressing unit 111 is executed (Step S502). On the contrary, if the switch over instruction signal does not instruct the first compression process (Step S501: No), the switches SW11 and SW12 are connected to the second compressing unit 112, and the compression process by the second compressing unit 112 is executed (Step S503). Thereafter, the transmitting unit 13 wirelessly transmits the compressed digital signal d output from the compressing unit 110 (Step S504) and ends this process. The above described process is processed repeatedly.

Figure 29:
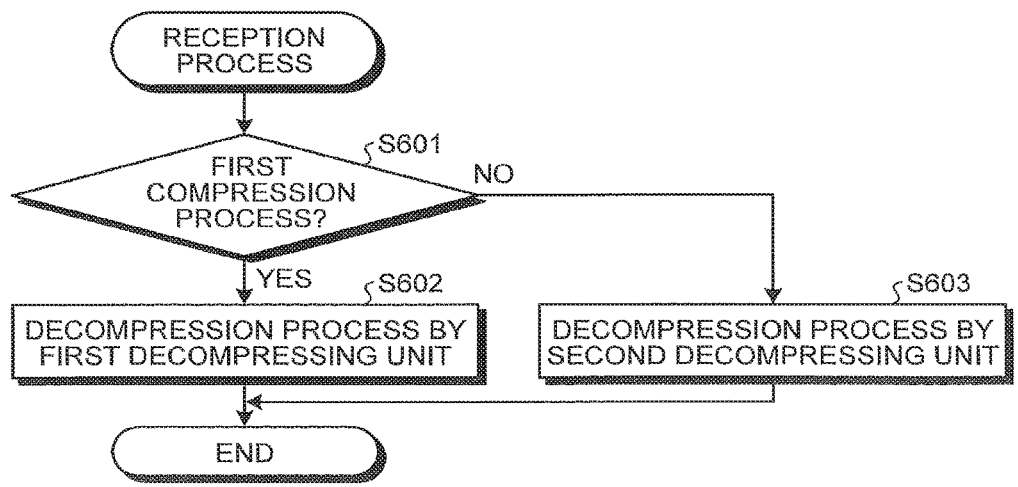
FIG. 29 is a flow chart illustrating a reception procedure of a receiving device according to the third embodiment.

As illustrated in FIG. 29, the receiving device 2 determines whether or not the switch over instruction signal instructing the first compression process has been input (Step S601). If the switch over instruction signal instructs the first compression process (Step S601: Yes), the switches SW21 and SW22 are connected to the first decompressing unit 121 and the decompression process by the first decompressing unit 121 is executed (Step S602). On the contrary, if the switch over instruction signal does not instruct the first compression process (Step S601: No), the switches SW21 and SW22 are connected to the second decompressing unit 122 and the decompression process by the second decompressing unit 122 is executed (Step S603). The above described process is processed repeatedly.

In the first embodiment, the compression and decompression processes using the extracted observation matrix $\Phi a$ corresponding to the Walsh function are executed, and accurate decompression is achieved by making limitation to the specific frequency component even if the input digital signal x has low sparsity. However, the first embodiment has limitation on the frequency domain to be decompressed. On the contrary, by the conventional compression and decompression processes using the random observation matrix $\Phi$, decompression of the entire frequency domain is possible, but unless the sparsity is high, the decompression error becomes large.

In this third embodiment, if the sparsity of the input digital signal x is able to be determined to be low by investigating characteristics of the decompressed digital signal x', switch over to the compression and decompression processes by the first compressing unit 111 and the first decompressing unit 121 by use of the extracted observation matrix $\Phi a$ corresponding to the Walsh function is executed.

Further, if the sparsity of the input digital signal x is able to be determined to be high, switch over to the compression and decompression processes by the second compressing unit 112 and the second decompressing unit 122 by use of the random observation matrix $\Phi$ is executed. As a result, even if the sparsity of the input digital signal x is low, vibration near the natural frequency is able to be decompressed accurately, and if the input digital signal x is highly sparse, a signal of a wide frequency range is able to decompressed. That is, versatile compression and decompression processes are able to be realized such that accurate decompression is able to be executed correspondingly with various input digital signals x.

If an event, such as an earthquake, occurs upon application to health monitoring of a structure with an accelerometer, natural vibration of various modes may be induced. In this case, usage, such as switching over to the compression and decompression processes using the random observation matrix $\Phi$ to investigate how the structure vibrates over a wide frequency range, and normally executing the compression and decompression processes using the extracted observation matrix $\Phi a$ corresponding to the Walsh function to monitor in detail a frequency domain near the natural frequency, becomes possible.

Further, one may consider usage, such as normally monitoring a frequency domain near a natural frequency in detail by executing the compression and decompression processes using the extracted observation matrix $\Phi a$ corresponding to the Walsh function, and when a large change is observed in the natural frequency, in order to check how the structure vibrates over a wide frequency domain, switching over to the compression and decompression processes using the random observation matrix $\Phi$. That is, by application of this third embodiment, the application range of the signal processing system and signal processing method is able to be enlarged.

Modification of Third Embodiment

Figure 30:
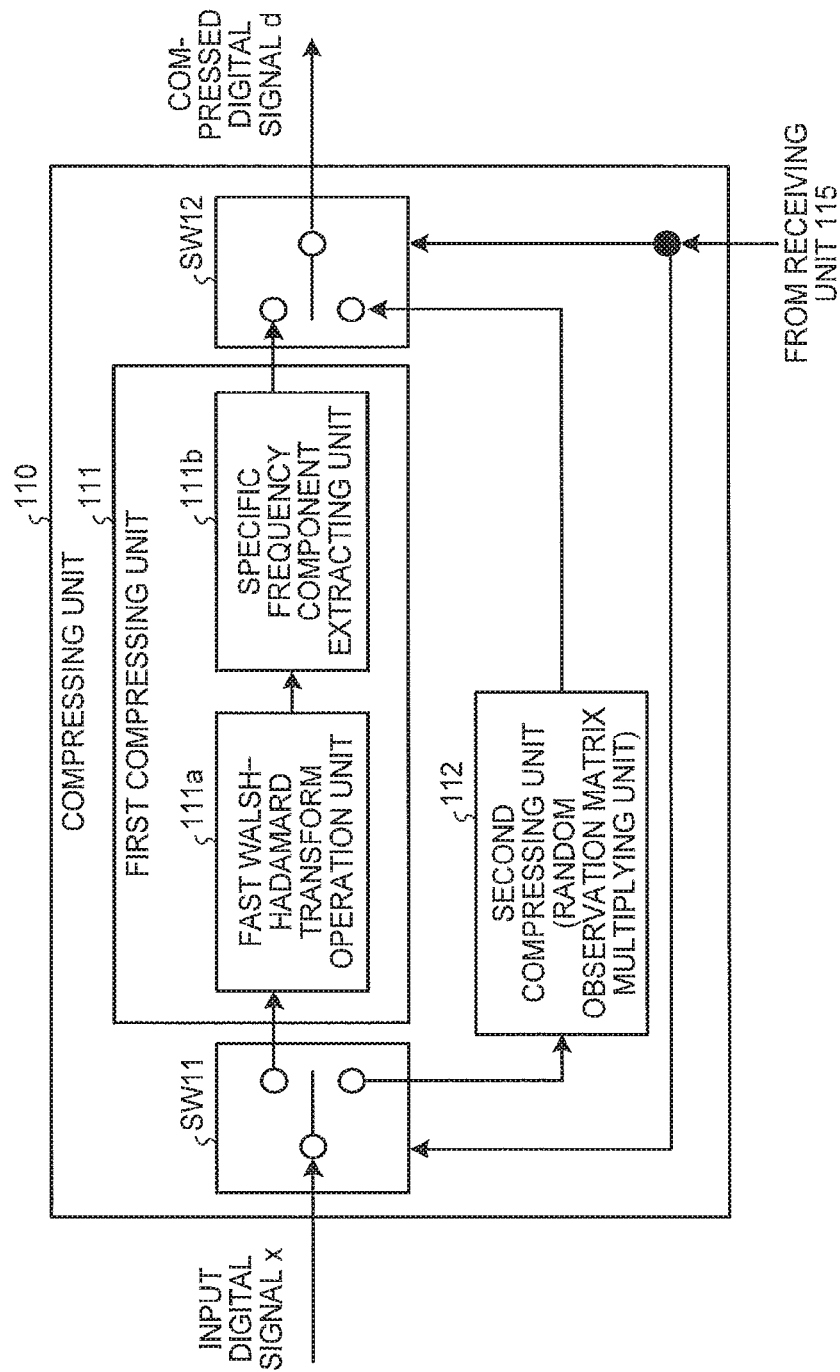
FIG. 30 is a block diagram illustrating a detailed configuration of a compressing unit according to a modification of the third embodiment.

According to a modification of this third embodiment, as illustrated in FIG. 30 and FIG. 31, the first compressing unit 111 of the third embodiment has been replaced with the compressing unit 11 of the second embodiment, and the first decompressing unit 121 of the third embodiment 3 has been replaced with the decompressing unit 22 of the second embodiment. Therefore, the first compressing unit 111 has a fast Walsh-Hadamard transform operation unit 111a corresponding to the fast Walsh-Hadamard transform operation unit 31, and a specific frequency component extracting unit 111b corresponding to the specific frequency component extracting unit 32. Similarly, the first decompressing unit 121 has a rearranging unit 121a corresponding to the rearranging unit 41 and a decompression operation unit 121b corresponding to the decompression operation unit 42. By this modification of the third embodiment, effects similar to those of the third embodiment are demonstrated.

According to some embodiments, since the compressing unit generates and outputs the compressed digital signal compressed by the conversion of the input digital signal using the Walsh function and the extraction of the specific frequency component, even if the original input digital signal has low sparsity, accurate decompression with respect to the specific frequency component is able to be executed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A receiving device, comprising:
a receiver configured to receive a compressed digital signal;
at least one memory storing instructions; and
at least one processor that executes the instructions to cause the receiving device to:
decompress a compressed digital signal, which has been compressed by being converted by use of a Walsh function and a specific frequency component being extracted, into a transmission side input digital signal, by using an observation matrix corresponding to a Walsh function of the specific frequency component and a basis transformation matrix corresponding to inverse discrete Fourier transform.

2. A transmitting and receiving system, comprising:
a transmitting device, having:
at least one memory storing instructions;
at least one processor that executes the instructions to cause the transmitting device to:
generate a compressed digital signal that has been compressed, by converting an input digital signal by use of a Walsh function and extracting a specific frequency component; and
a transmitter configured to wirelessly transmit and output the compressed digital signal; and
a receiving device, having:
a receiver configured to receive the compressed digital signal wirelessly transmitted and output by the transmitter;
at least one memory storing instructions; and
at least one processor that executes the instructions stored in the at least one memory of the receiving device to cause the receiving device to:
decompress the compressed digital signal received by the receiver into the input digital signal by using an observation matrix corresponding to a Walsh function of the specific frequency component and a basis transformation matrix corresponding to inverse discrete Fourier transform.

3. The transmitting and receiving system according to claim 2, wherein the at least one processor of the transmitting device executes the instructions stored in the at least one memory of the transmitting device to cause the transmitting device to:
convert the input digital signal by using the observation matrix corresponding to the Walsh function of the specific frequency component to generate and output the converted digital signal as the compressed digital signal.

4. The transmitting and receiving system according to claim 3, wherein the observation matrix corresponding to the Walsh function of the specific frequency component is a matrix having rows that have been picked out from a Walsh function, the rows corresponding to the specific frequency component.

5. The transmitting and receiving system according to claim 2, wherein the at least one processor of the receiving device executes the instructions stored in the at least one memory of the receiving device to cause the receiving device to:
subject the input digital signal to fast Walsh-Hadamard transform, and pick out and output, from the transformed digital signal, a portion corresponding to the specific frequency component.

6. The transmitting and receiving system according to claim 5, wherein
the at least one processor of the transmitting device executes the instructions stored in the at least one memory of the transmitting device to cause the transmitting device to:
pick out the portion corresponding to the specific frequency component without rearranging the portion corresponding to the specific frequency component in frequency order of the Walsh function; and
generate and output, as the compressed digital signal, the portion picked out, and
the at least one processor of the receiving device executes the instructions stored in the at least one memory of the receiving device to cause the receiving device to:
rearrange the compressed digital signal that has been input, in frequency order of the Walsh function; and
decompress the compressed digital signal that has been rearranged, into the input digital signal, by using the observation matrix corresponding to the Walsh function of the specific frequency component and the basis transformation matrix corresponding to inverse discrete Fourier transform.

7. A transmitting and receiving system, comprising:
a transmitting device, having:
at least one memory;
at least one processor coupled to the at least one memory and configured to:
perform a first compression process of generating a first compressed digital signal that has been compressed, by converting an input digital signal by use of a Walsh function and extracting a specific frequency component;
perform a second compression process of generating a second compressed digital signal that has been compressed, by converting an input digital signal with an observation matrix that uses a random matrix; and
switch between performing the first compression process to generate the first compressed digital signal and performing the second compression process to generate the second compressed digital signal, based on a switch over instruction signal; and
a transmitter configured to wirelessly transmit and output the first compressed digital signal or the second compressed digital signal that has been generated by the at least one processor; and
a receiving device, having:
a receiver configured to receive the first compressed digital signal or the second compressed digital signal that has been wirelessly transmitted and output by the transmitting unit;
at least one memory; and
at least one processor coupled to the at least one memory of the receiving device and configured to:
generate the switch over instruction signal;
perform a first decompression process of decompressing the first compressed digital signal into the input digital signal by using an observation matrix corresponding to a Walsh function of the specific frequency component, when the switch over instruction signal instructs the at least one processor of the transmitting device to perform the first compression process;

perform a second decompression process of decompressing the second compressed digital signal into the input digital signal by using the observation matrix that uses the random matrix, when the switch over instruction signal instructs the at least one processor of the transmitting device to perform the first compression process;

switch between performing the first decompression process and performing the second decompression process, based on the switch over instruction signal; and control the receiving device to send out the switch over instruction signal to the transmitting device.

8. The transmitting and receiving system according to claim 7, wherein the at least one processor of the transmitting device is configured to:

convert the input digital signal by using the observation matrix corresponding to the Walsh function of the specific frequency component to generate and output the converted digital signal as the first compressed digital signal.

9. The transmitting and receiving system according to claim 7, wherein the at least one processor of the transmitting device is configured to:

subject the input digital signal to fast Walsh-Hadamard transform, and pick out and output, from the transformed digital signal, a portion corresponding to the specific frequency component.

10. The transmitting and receiving system according to claim 7, wherein the at least one processor of the receiving device is configured to:

execute the first decompression of decompressing the first compressed digital signal into the input digital signal by using the observation matrix corresponding to the Walsh function of the specific frequency component and a basis transformation matrix corresponding to inverse discrete Fourier transform.

* * * * *